(12) United States Patent
Inden

(10) Patent No.: US 12,300,697 B2
(45) Date of Patent: May 13, 2025

(54) METHOD OF MANUFACTURING A SEMICONDUCTOR MEMORY DEVICE WITH A LOW VOLTAGE TRANSISTOR

(71) Applicant: Kioxia Corporation, Minato-ku (JP)

(72) Inventor: Tomoya Inden, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 60 days.

(21) Appl. No.: 18/110,935

(22) Filed: Feb. 17, 2023

(65) Prior Publication Data
US 2023/0207564 A1    Jun. 29, 2023

Related U.S. Application Data

(63) Continuation of application No. 16/818,300, filed on Mar. 13, 2020, now Pat. No. 11,616,063.

(30) Foreign Application Priority Data

Sep. 13, 2019   (JP) .................................. 2019-167653

(51) Int. Cl.
| | |
|---|---|
| *H01L 27/092* | (2006.01) |
| *H01L 21/8238* | (2006.01) |
| *H01L 23/528* | (2006.01) |
| *H01L 23/535* | (2006.01) |
| *H10B 43/27* | (2023.01) |
| *H10B 43/40* | (2023.01) |

(52) U.S. Cl.
CPC .. *H01L 27/0922* (2013.01); *H01L 21/823857* (2013.01); *H01L 23/528* (2013.01); *H01L 23/535* (2013.01); *H10B 43/27* (2023.02); *H10B 43/40* (2023.02)

(58) Field of Classification Search
CPC .............. H01L 23/538; H01L 23/535; H01L 21/823857; H01L 21/823842; H01L 27/0688; H01L 27/092; H01L 27/0922
See application file for complete search history.

(56) References Cited

U.S. PATENT DOCUMENTS

| | | | |
|---|---|---|---|
| 5,744,845 A | 4/1998 | Sayama et al. | |
| 9,406,694 B1 | 8/2016 | Ikeno et al. | |
| 10,256,099 B1 * | 4/2019 | Akaiwa | ............... H01L 29/7832 |

(Continued)

FOREIGN PATENT DOCUMENTS

| | | |
|---|---|---|
| JP | 9-92728 A | 4/1997 |
| JP | 2016-225434 A | 12/2016 |

*Primary Examiner* — Didarul A Mazumder
*Assistant Examiner* — Gustavo G Ramallo
(74) *Attorney, Agent, or Firm* — Oblon, McClelland, Maier & Neustadt, L.L.P.

(57) ABSTRACT

According to one embodiment, a semiconductor device includes: a first well region of N-type and a second well region of P-type; a PMOS transistor provided in the first well region; and an NMOS transistor provided in the second well region. The PMOS transistor includes a first gate insulating layer and a first gate electrode. The NMOS transistor includes a second gate insulating layer and a second gate electrode. The first gate electrode includes a first semiconductor layer of P-type, a first insulating layer, and a first conductive layer. The second gate electrode includes a second semiconductor layer of N-type, a second insulating layer, and a second conductive layer. A film thickness of the first insulating layer is thicker than a film thickness of the second insulating layer.

10 Claims, 16 Drawing Sheets

(56) References Cited

U.S. PATENT DOCUMENTS

| | | |
|---|---|---|
| 2002/0074576 A1 | 6/2002 | Beaman |
| 2005/0023603 A1 | 2/2005 | Eldridge |
| 2009/0256211 A1* | 10/2009 | Booth, Jr. ....... H01L 21/823857 |
| | | 257/E21.294 |
| 2012/0063212 A1* | 3/2012 | Kanda ............. H01L 21/823842 |
| | | 257/E21.616 |
| 2014/0027838 A1* | 1/2014 | Kido ................. H01L 29/66833 |
| | | 438/269 |
| 2014/0264537 A1 | 9/2014 | Sakamoto |
| 2020/0194450 A1 | 6/2020 | Pachamuthu |
| 2020/0303383 A1* | 9/2020 | Kodama ......... H01L 21/823842 |
| 2024/0306358 A1* | 9/2024 | Wang ................ H01L 29/78696 |

* cited by examiner

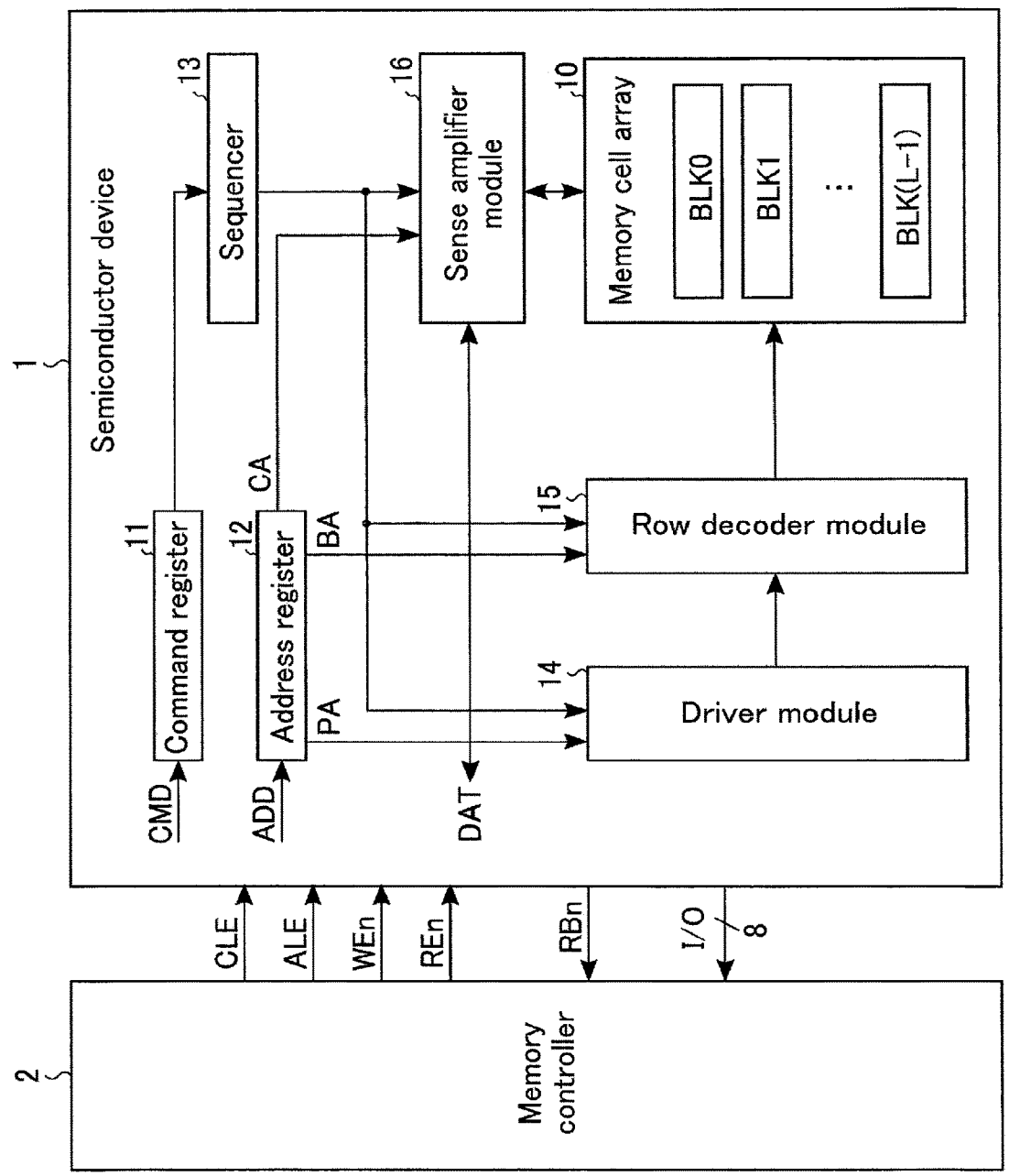
F I G. 1

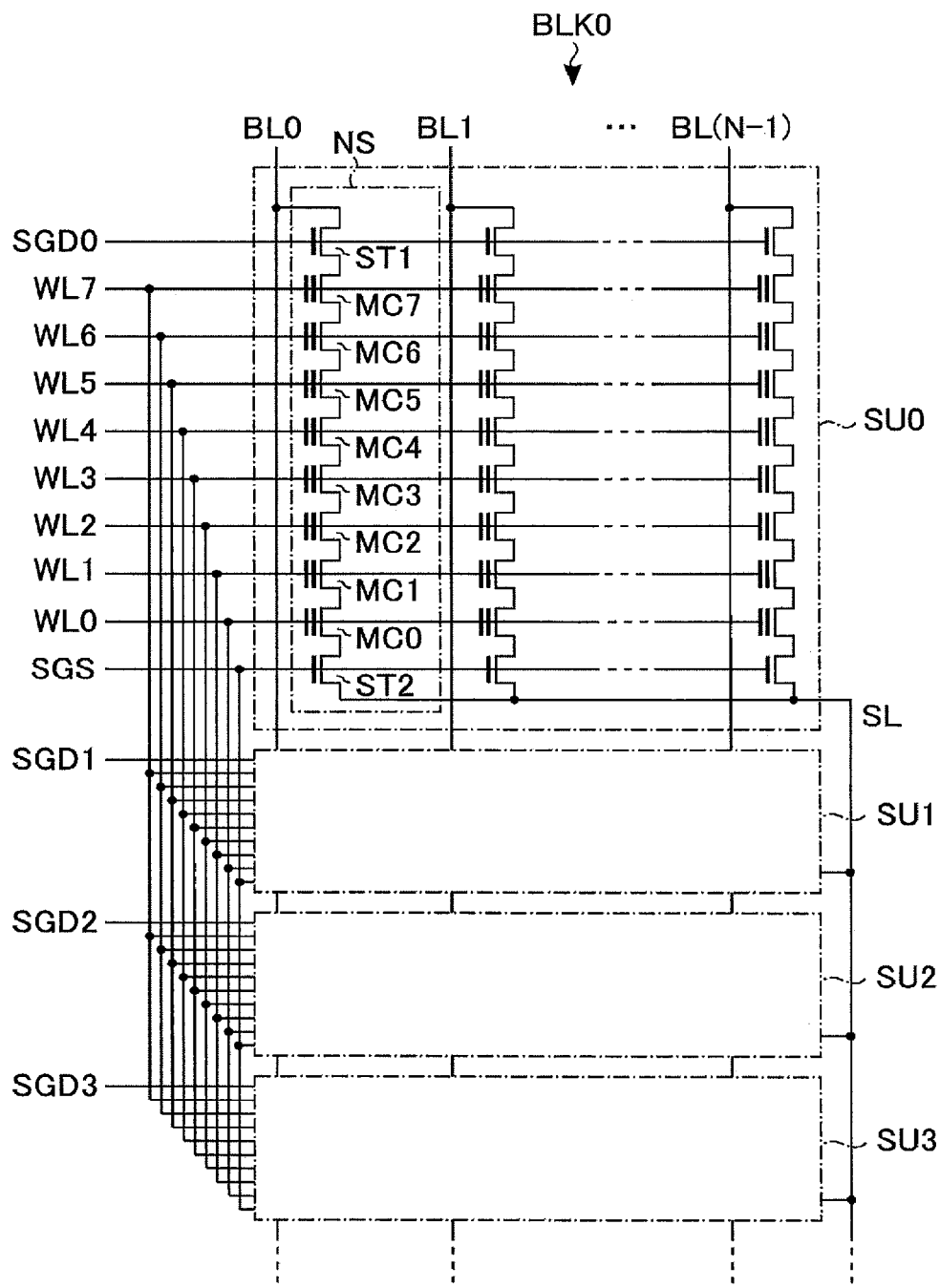
F I G. 2

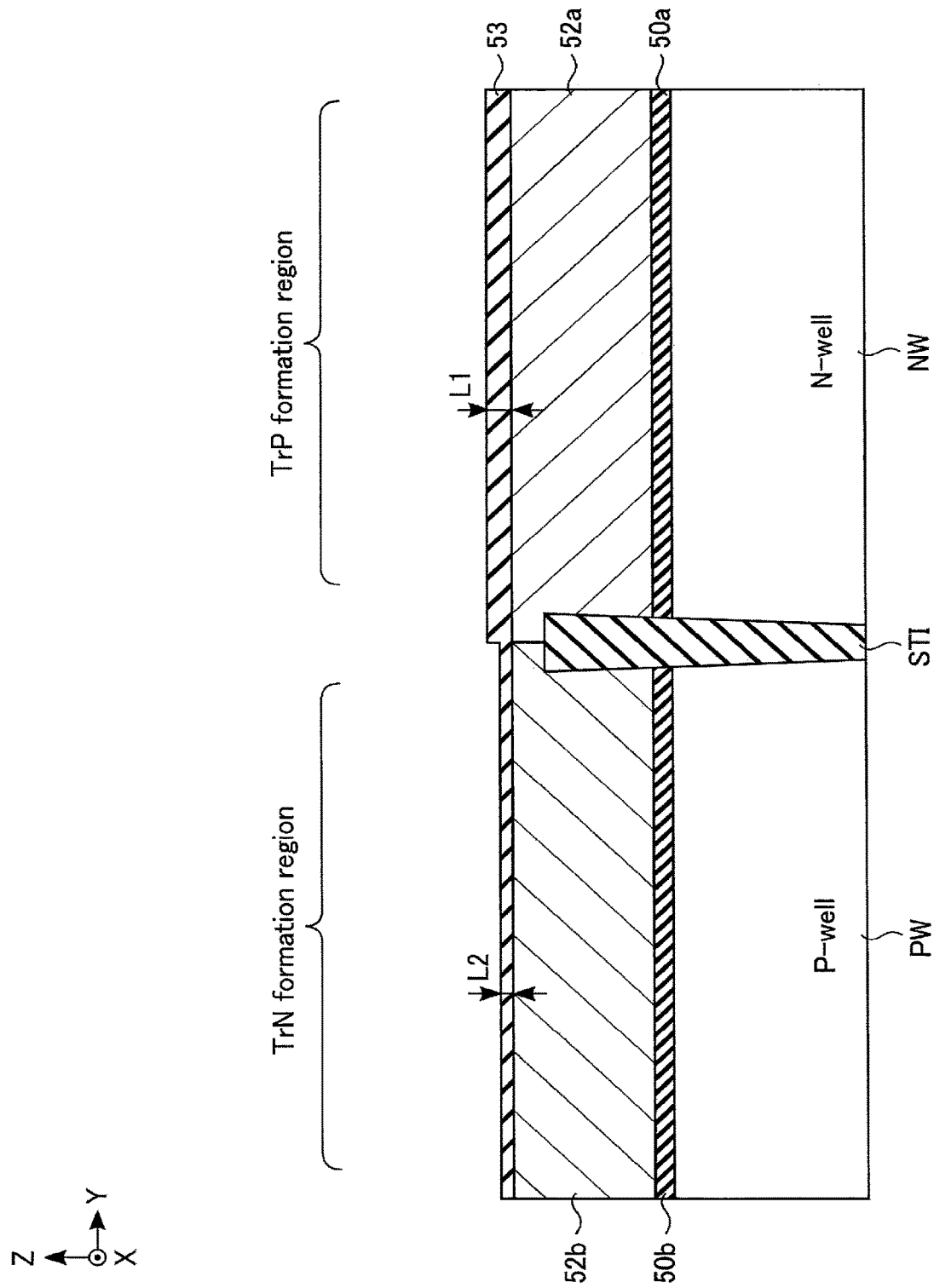
F I G. 8

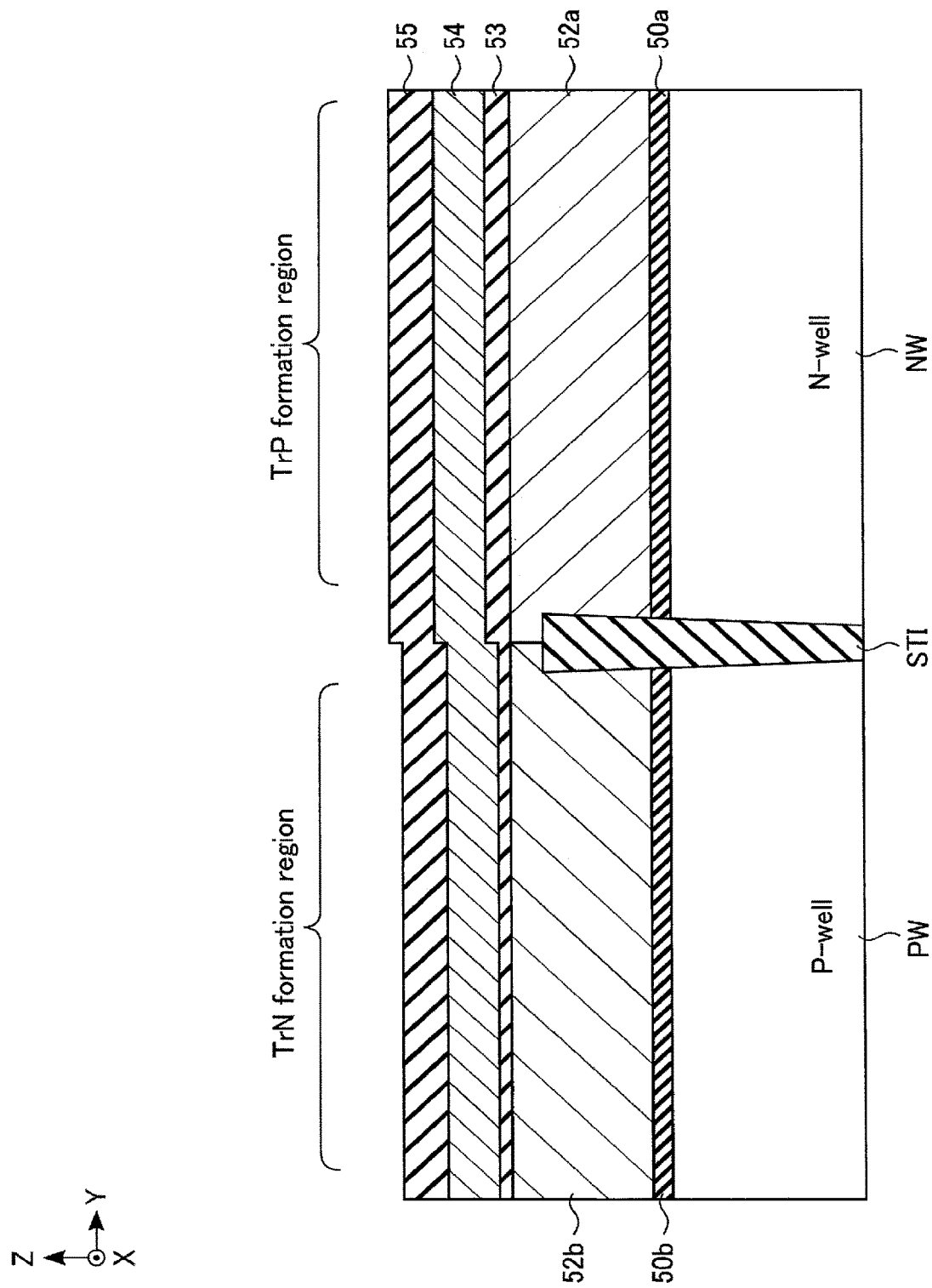
F I G. 9

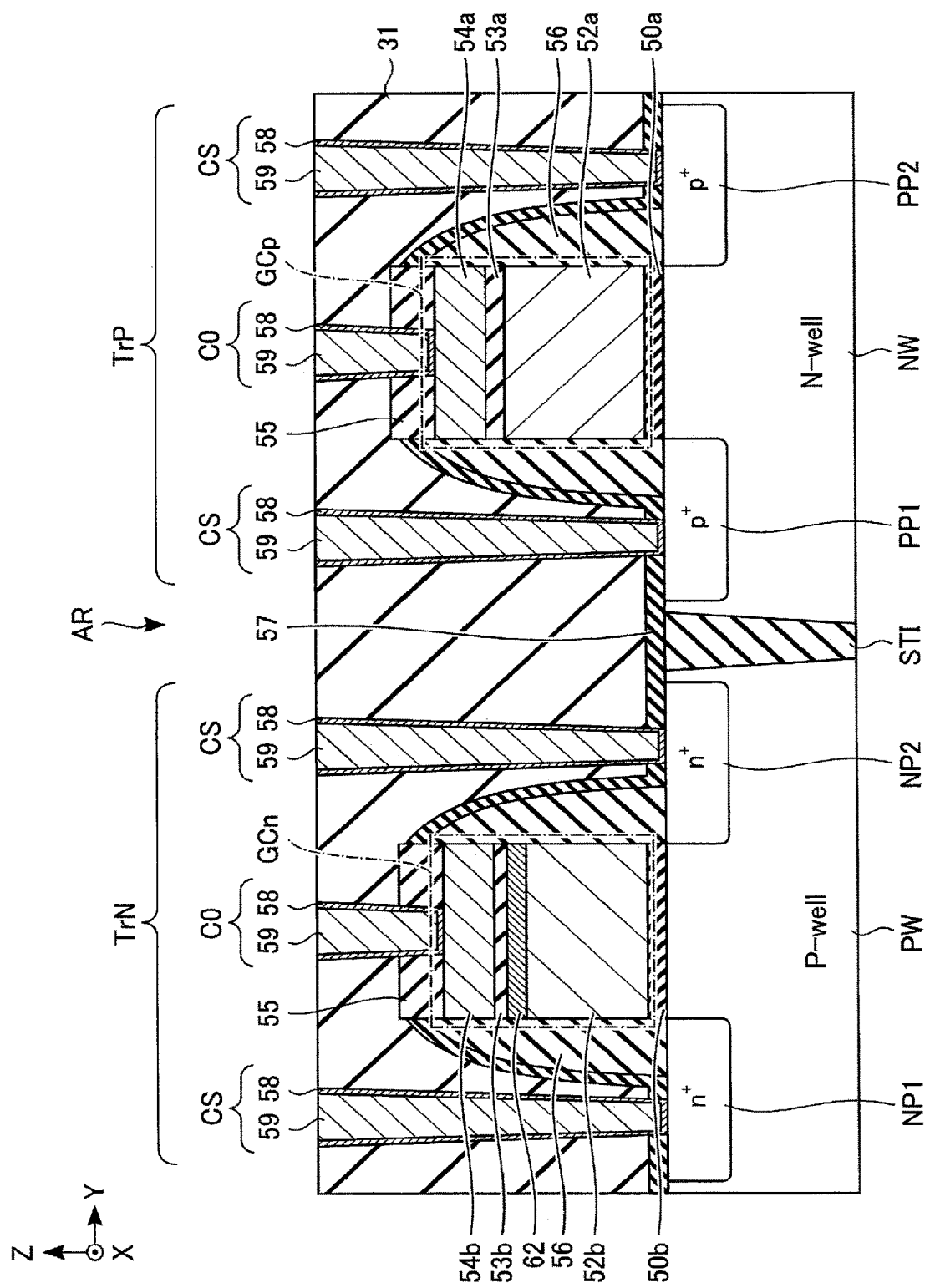
F I G. 11

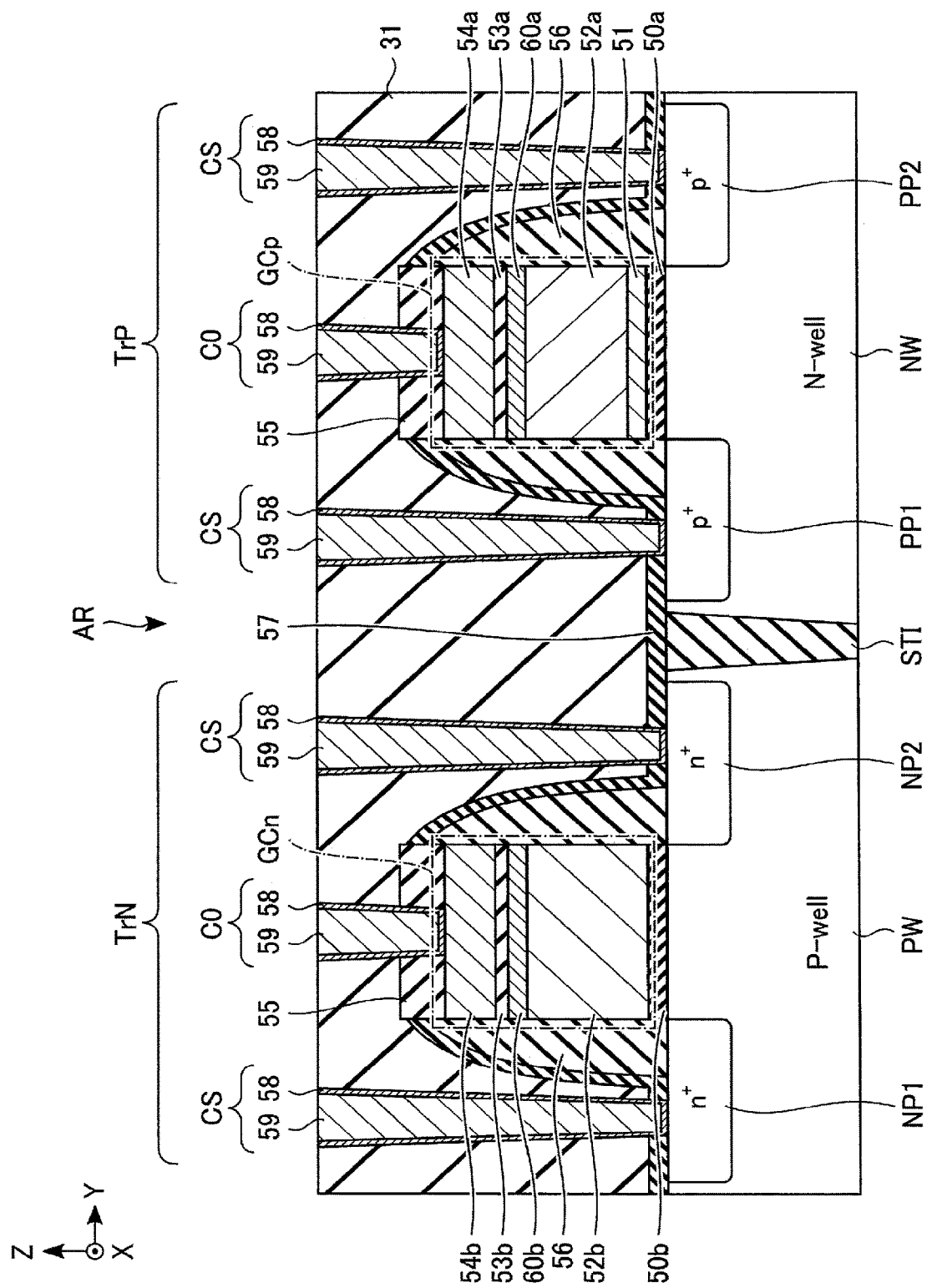
F I G. 16

METHOD OF MANUFACTURING A SEMICONDUCTOR MEMORY DEVICE WITH A LOW VOLTAGE TRANSISTOR

CROSS-REFERENCE TO RELATED APPLICATIONS

This application is a continuation of and claims the benefit of priority under 35 U.S.C. § 120 from U.S. application Ser. No. 16/818,300 filed Mar. 13, 2020, and claims the benefit of priority under 35 U.S.C. § 119 from Japanese Application No. 2019-167653 filed Sep. 13, 2019, the entire contents of each of which are incorporated herein by reference.

FIELD

Embodiments described herein relate generally to a semiconductor device and a semiconductor memory device.

BACKGROUND

As one type of transistor used in a semiconductor device, a very low voltage transistor is known. The very low voltage transistor is a transistor designed for high-speed operation. However, the very low voltage transistor may deteriorate in characteristics during the manufacture of the very low voltage transistor, due to the configuration of a gate electrode.

BRIEF DESCRIPTION OF THE DRAWINGS

FIG. 1 is a block diagram showing a configuration example of a semiconductor device according to a first embodiment;

FIG. 2 is a circuit diagram showing a circuit configuration of a memory cell array provided in the semiconductor device according to the first embodiment;

FIGS. 5-9 are diagrams showing an example of a process of manufacturing the semiconductor device according to the first embodiment;

FIG. 11 is a cross-sectional view showing an example of a PMOS transistor and an NMOS transistor that are provided in a semiconductor device according to a third embodiment;

FIG. 16 is a cross-sectional view showing an example of a PMOS transistor and an NMOS transistor that are provided in a semiconductor device according to a sixth embodiment.

DETAILED DESCRIPTION

Figure 3:
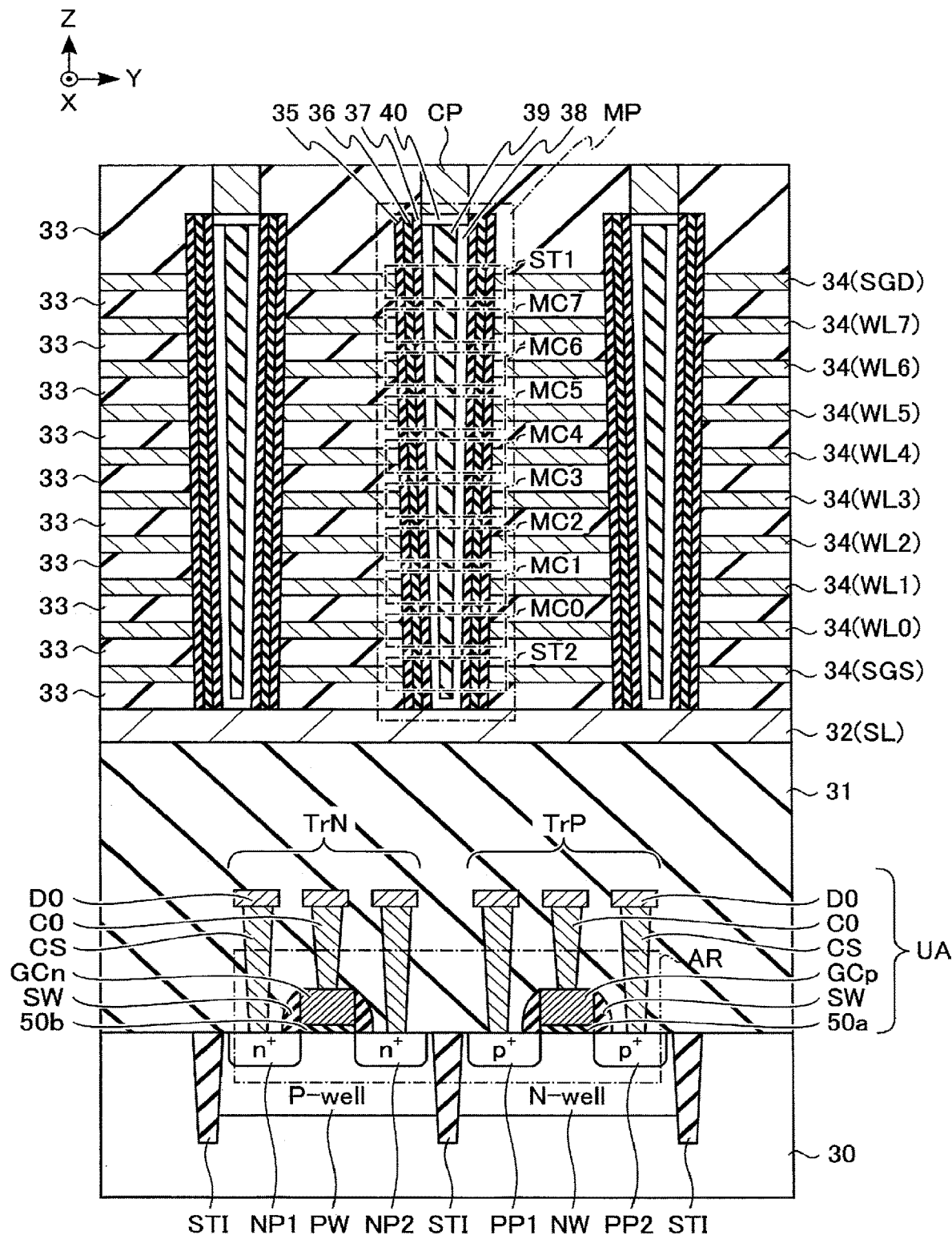
FIG. 3 is a cross-sectional view showing an example of a memory cell array and a very low voltage transistor that are provided in the semiconductor device according to the first embodiment.

In general, according to one embodiment, a semiconductor device includes: a first well region of N-type and a second well region of P-type, the first well region and the second well region are provided in a surface region of a substrate; a PMOS transistor provided in the first well region; and an NMOS transistor provided in the second well region. The PMOS transistor includes: a first gate insulating layer provided on the first well region; and a first gate electrode provided on the first gate insulating layer. The NMOS transistor includes: a second gate insulating layer provided on the second well region; and a second gate electrode provided on the second gate insulating layer. The first gate electrode includes: a first semiconductor layer of P-type; a first insulating layer provided on the first semiconductor layer; and a first conductive layer provided on the first insulating layer. The second gate electrode includes: a second semiconductor layer of N-type; a second insulating layer provided on the second semiconductor layer; and a second conductive layer provided on the second insulating layer. A film thickness of the first insulating layer is thicker than a film thickness of the second insulating layer.

1. First Embodiment

A semiconductor device according to the first embodiment will be described. In the descriptions below, the semiconductor device will be described, referring to a three-dimensionally stacked NAND-type flash memory wherein memory cell transistors are stacked three-dimensionally above a semiconductor substrate.

1.1 Configuration

1.1.1 Configuration of Semiconductor Device

First, an overall configuration of a semiconductor device 1 will be described with reference to FIG. 1. In the example shown in FIG. 1, part of the connections between blocks are shown by arrow lines, but the connections between the blocks are not limited to this.

As shown in FIG. 1, the semiconductor device 1 is controlled by, for example, an external memory controller 2. The semiconductor device 1 includes a memory cell array 10, a command register 11, an address register 12, a sequencer 13, a driver module 14, a row decoder module 15, and a sense amplifier module 16.

The memory cell array 10 includes a plurality of blocks BLK0 to BLK(L−1) (L is an integer of 2 or more). The block BLK is a group of memory cell transistors (hereinafter also referred to as memory cells) capable of storing data in a nonvolatile manner, and is used, for example, as a data erase unit.

The memory cell array 10 is provided with a plurality of bit lines and a plurality of word lines. For example, each memory cell transistor is associated with one bit line and one word line. A detailed configuration of the memory cell array 10 will be described later.

The command register 11 holds a command CMD which the semiconductor device 1 receives from the memory controller 2. The command CMD includes, for example, an instruction to cause the sequencer 13 to execute a read operation, a write operation, an erase operation, etc.

The address register 12 holds address information ADD which the semiconductor device 1 receives from the memory controller 2. The address information ADD includes, for example, a block address BA, a page address PA, and a column address CA. For example, the block address BA, the page address PA, and the column address CA are used to select a block BLK, a word line, and a bit line, respectively.

The sequencer 13 controls the overall operation of the semiconductor device 1. For example, the sequencer 13 controls the driver module 14, row decoder module 15, sense amplifier module 16 etc., based on the command CMD held in the command register 11, and executes a read operation, a write operation, an erase operation, etc.

The driver module 14 generates voltages used in the read operation, write operation, erase operation, etc. Also, the driver module 14 applies the generated voltages to the signal line corresponding to a selected word line, based on, for example, the page address PA held in the address register 12. The row decoder module 15 selects corresponding one of blocks BLK in the memory cell array 10, based on the block address BA held in the address register 12. Also, the row decoder module 15 transfers, for example, a voltage applied to the signal line corresponding to the selected word line to the selected word line in the selected block BLK.

The sense amplifier module 16 applies a desired voltage to each bit line in accordance with the write data DAT received from the memory controller 2 in the write operation. Also, in the read operation, the sense amplifier module 16 determines data stored in the memory cell, based on the voltage or the current of the bit line, and transfers the determination result to the memory controller 2 as read data DAT.

Communications between the semiconductor device 1 and the memory controller 2 support, for example, a NAND interface standard. For example, in the communications between the semiconductor device 1 and the memory controller 2, a command latch enable signal CLE, an address latch enable signal ALE, a write enable signal WEn, a read enable signal REn, a ready/busy signal RBn and an input/output signal I/O are used.

The command latch enable signal CLE is a signal indicating that the input/output signal I/O received by the semiconductor device 1 is a command CMD. The address latch enable signal ALE is a signal indicating that the input/output signal I/O received by the semiconductor device 1 is address information ADD. The write enable signal WEn is a signal instructing the semiconductor device 1 to input the input/output signal I/O. The read enable signal REn is a signal instructing the semiconductor device 1 to output the input/output signal I/O.

The ready/busy signal RBn is a signal notifying the memory controller 2 whether the semiconductor device 1 is in a ready state in which an instruction from the memory controller 2 is accepted or in a busy state in which the instruction is not accepted.

The input/output signal I/O is, for example, an 8-bit signal and may include a command CMD, address information ADD, data DAT, etc.

The semiconductor device 1 and memory controller 2 described above may constitute one semiconductor device by combining them together. Examples of such a semiconductor device include a memory card such as an SD™ card, and a solid state drive (SSD).

1.1.2 Circuit Configuration of Memory Cell Array

Next, a circuit configuration of the memory cell array 10 will be described with reference to FIG. 2. The example in FIG. 2 shows block BLK0, but the configuration of the other blocks BLK is the same.

As shown in FIG. 2, block BLK includes, for example, four string units SU0 to SU3. Each string unit SU includes a plurality of NAND strings NS.

The NAND strings NS are respectively associated with bit lines BL0 to BL(N−1) (N is an integer of 2 or more). Each NAND string NS includes, for example, memory cell transistors MC0 to MC7 and selection transistors ST1 and ST2.

Each of the memory cell transistors MC includes a control gate and a charge storage layer, and holds data in a non-volatile manner. Where the memory cell transistors MC0 to MC7 do not have to be discriminated from each other, each of them will be hereinafter expressed as memory cell transistor MC. The memory cell transistor MC may be a MONOS type using an insulating film as a charge storage layer, or an FG type using a conductive layer as a charge storage layer. In connection with the present embodiment, the MONOS type will be described by way of example.

The selection transistor ST1 is used for selecting string unit SU during various operations.

In each NAND string NS, a drain of the selection transistor ST1 is coupled to the associated bit line BL. A source of the selection transistor ST1 is coupled to one end of the memory cell transistors MC0 to MC7 coupled in series. The other end of the memory cell transistors MC0 to MC7 coupled in series is coupled to a drain of the selection transistor ST2. The NAND string NS may include other transistors between the selection transistor ST1 and the memory cell transistor MC0 or the selection transistor ST2 and the memory cell transistor MC7, for example a further selection transistor and a dummy memory cell transistor.

Sources of the selection transistors ST2 included in the same block BLK are commonly coupled to a source line SL. Gates of the selection transistors ST1 in the string units SU0 to SU3 are commonly coupled to selection gate lines SGD0 to SGD3, respectively. The control gates of the memory cell transistors MC0 to MC7 are commonly coupled to the word lines WL0 to WL7, respectively. Gates of the selection transistors ST2 are commonly coupled to a selection gate line SGS.

In the circuit configuration of the memory cell array 10 described above, a plurality of NAND strings NS to which the same column address CA is assigned are commonly coupled to the same bit line BL between the plurality of blocks BLK. The source lines SL are commonly coupled between the plurality of blocks BLK.

The circuit configuration of the memory cell array 10 included in the semiconductor device 1 according to the embodiment is not limited to the configuration described above. For example, the numbers of memory cell transistors MC and the selection transistors ST1 and ST2 included in each NAND string NS may be designed to be arbitrary numbers. Also, the number of string units SU included in each block BLK may be designed to be arbitrary number.

1.1.3 Cross-Sectional View Showing Example of Memory Cell Array and Very Low Voltage Transistor Next, a cross-sectional structure of the memory cell array 10 and the very low voltage transistor will be described with reference to FIG. 3.

As shown in FIG. 3, an insulating layer 31 is formed on a semiconductor substrate 30. The insulating layer 31 includes silicon oxide ($SiO_2$), for example. A circuit area UA is provided in the insulating layer 31, and the memory cell array 10 is provided on the insulating layer 31. For example, a circuit used for the sense amplifier module 16 or the like is formed in the circuit area UA.

First, a configuration of the memory cell array 10 will be described.

A conductive layer 32 functioning as source line SL is provided on the insulating layer 31. The conductive layer 32 is formed, for example, as a plate shape spreading along an XY plane substantially parallel to the semiconductor substrate 30. The conductive layer 32 is made of a conductive material, and the conductive material includes, for example, a metal material or a semiconductor material.

Eleven insulating layers 33 and ten conductive layers 34 are alternately stacked on the conductive layer 32. The insulating layers 33 include $SiO_2$, for example. The ten conductive layers 34 function, for example, as the selection gate line SGS, the word lines WL0 to WL7 and the selection gate line SGD in order from the bottom. The conductive layers 34 are formed, for example, as plates extending in the X direction. The conductive layers 34 are made of a conductive material, and the conductive material includes, for example, a metal material.

A plurality of memory pillars MP are provided which penetrate (pass through) the ten conductive layers 34 and the bottom surfaces of which reach the conductive layer 32. The memory pillars MP extend along the Z direction that is substantially perpendicular to the semiconductor substrate and intersects the X and Y directions. One of the memory pillars MP corresponds to one NAND string NS. Each memory pillar MP includes a block insulating film 35, a charge storage layer 36, a tunnel insulating film 37, a semiconductor layer 38, a core layer 39, and a cap layer 40.

More specifically, holes corresponding to the memory pillars MP are formed such that they penetrate the ten conductive layers and their bottom surfaces reach the conductive layer 32. The block insulating film 35, the charge storage layer 36, and the tunnel insulating film 37 are formed on the side wall of each hole in the order mentioned. The semiconductor layer 38 is formed such that its side surface is in contact with the tunnel insulating film 37 and its bottom surface is in contact with the conductive layer 32. The semiconductor layer 38 is a region where channels of the memory cell transistors MC and the selection transistors ST1 and ST2 are formed. Therefore, the semiconductor layer 38 functions as a signal line that couples the current paths of the selection transistor ST2, the memory cell transistors MC0 to MC7, and the selection transistor ST1. The core layer 39 is provided in the semiconductor layer 38. On the semiconductor layer 38, and the core layer 39, the cap layer 40 whose side surface is in contact with the tunnel insulating film 37 is formed.

The block insulating film 35, the tunnel insulating film 37, and the core layer 39 includes $SiO_2$, for example. The charge storage layer 36 includes silicon nitride (SiN), for example.

The semiconductor layer 38 and the cap layer 40 include polysilicon, for example.

The memory pillar MP and the eight conductive layers 34 respectively functioning as the word lines WL0 to WL7 are combined in such a manner as to function as the memory cell transistors MC0 to MC7. Similarly, the memory pillar MP and the two conductive layers 34 respectively functioning as the selection gate lines SGD and SGS are combined in such a manner as to function as the selection transistors ST1 and ST2.

A contact plug CP is formed on the cap layer 40. A conductive layer (not shown) that functions as the bit line BL is formed on the contact plug CP. The contact plug CP is made of a conductive material, and the conductive material includes a metal material, for example.

In the example shown in FIG. 3, three memory pillars MP are arranged along the Y direction, but the arrangement of the memory pillars MP can be arbitrarily designed.

Next, the circuit area UA will be described.

The circuit area UA includes, for example, a P-channel MOSFET (hereinafter also referred to as "PMOS transistor TrP") and an N-channel MOSFET (hereinafter also referred to as "NMOS transistor TrN"). The PMOS transistor TrP and the NMOS transistor TrN mentioned here are very low voltage transistors designed for high-speed operation. The PMOS transistor TrP and the NMOS transistor TrN are used in a logic circuit that requires low voltage driving and high speed operation. The PMOS transistor TrP and the NMOS transistor TrN may be used in, for example, the command register 11, the address register 12, the sequencer 13, the driver module 14, the row decoder module 15, the sense amplifier module 16, etc.

For example, a P-type well region PW, an N-type well region NW, and an element isolation region ST1 are provided in the surface region (the region close to the surface) of the semiconductor substrate 30.

Each of the P-type well region PW, the N-type well region NW, and the element isolation region STI is in contact with the upper surface of the semiconductor substrate 30. The element isolation region STI is provided, for example, to electrically isolate the N-type well region NW and the P-type well region PW. The element isolation region STI includes $SiO_2$, for example.

A PMOS transistor TrP is provided in the N-type well region NW, and an NMOS transistor TrN is provided in the P-type well region PW.

The PMOS transistor TrP includes $p^+$ impurity diffusion regions PP1 and PP2, insulating layer 50a, a gate electrode GCp, and insulating layer SW provided on the side surface of the gate electrode GCp.

The $p^+$ impurity diffusion regions PP1 and PP2 are formed in the surface region (the region close to the surface) of the N-type well region NW, and are doped with boron (B), for example. The $p^+$ impurity diffusion region PP1 is arranged away from the $p^+$ impurity diffusion region PP2 in the Y direction. The $p^+$ impurity diffusion regions PP1 and PP2 function as a source (source diffusion layer) and a drain (drain diffusion layer) of the PMOS transistor TrP.

Insulating layer 50a is provided on that portion of the N-type well region NW which is between the $p^+$ impurity diffusion region PP1 and the $p^+$ impurity diffusion region PP2, and functions as a gate insulating film of the PMOS transistor TrP. The insulating layer 50a is made of an insulating material, and the insulating material includes, for example, a stacked structure of $SiO_2$ and SiN.

The gate electrode GCp is provided on the insulating layer 50a.

The insulating layer SW functions as sidewalls provided on the side surface of gate electrode GCp of the PMOS transistor TrP and the side surface of gate electrode GCn of the NMOS transistor TrN.

The NMOS transistor TrN includes $n^+$ impurity diffusion regions NP1 and NP2, insulating layer 50b, a gate electrode GCn, and insulating layer SW provided on the side surface of the gate electrode GCn.

The $n^+$ impurity diffusion regions NP1 and NP2 are formed in the surface region (the region close to the surface) of the P-type well region PW, and are doped with phosphorus (P), for example. The $n^+$ impurity diffusion region NP1 is arranged away from the $n^+$ impurity diffusion region NP2 in the Y direction. The n⁺ impurity diffusion regions NP1 and NP2 function as a source (source diffusion layer) and a drain (drain diffusion layer) of the NMOS transistor TrN.

The insulating layer 50b is provided on that portion of the P-type well region PW which is between the n⁺ impurity diffusion regions NP1 and NP2, and functions as a gate insulating film of the NMOS transistor TrN. The insulating layer 50b is made of an insulating material, and the insulating material includes, for example, a stacked structure of $SiO_2$ and SiN.

The gate electrode GCn is provided on the insulating layer 50b.

The circuit area UA includes, for example, contact plugs CS and C0 and a conductive layer D0.

The conductive layer D0 functions as an interconnect provided above the PMOS transistor TrP and the NMOS transistor TrN.

The contact plug CS is a conductive layer provided between the sources or drains of the PMOS transistor TrP and the NMOS transistor TrN, and the conductive layer D0. The contact plug C0 is a conductive layer provided between the gate electrodes of the PMOS transistor TrP and the NMOS transistor TrN, and the conductive layer D0. Each of the p⁺ impurity diffusion regions PP1 and PP2 and the n⁺ impurity diffusion regions NP1 and NP2 is electrically coupled to a different conductive layer D0 through the contact plug CS. Each of the gate electrodes GCp and GCn is electrically coupled to a different conductive layer D0 through the contact plug C0.

1.1.4 Configurations of PMOS Transistor and NMOS Transistor

Figure 4:
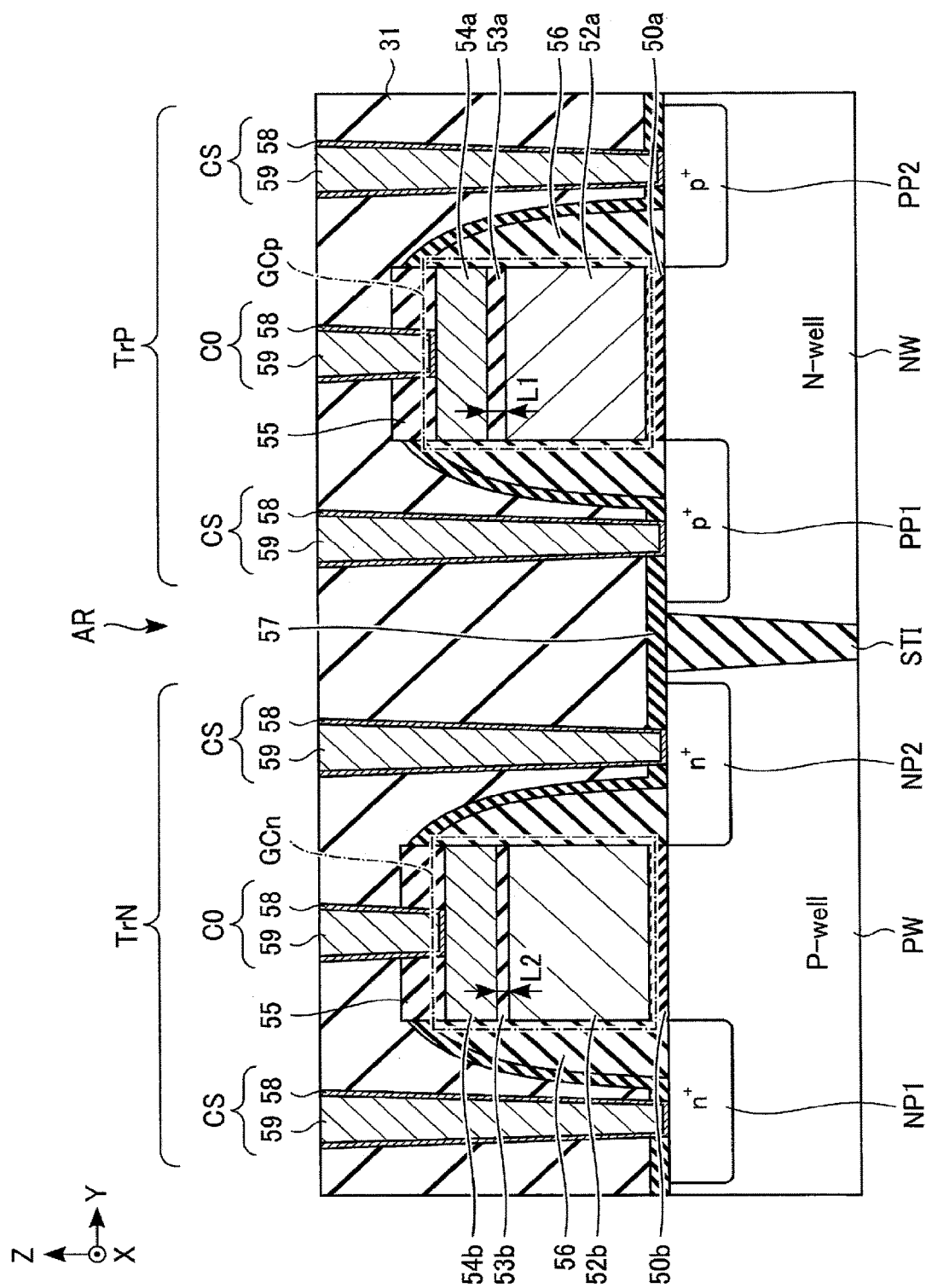
FIG. 4 is a cross-sectional view showing an example of a PMOS transistor and an NMOS transistor that are provided in the semiconductor device according to the first embodiment.

Next, detailed configurations of the PMOS transistor TrP and the NMOS transistor TrN will be described with reference to FIG. 4. FIG. 4 shows area AR depicted in FIG. 3.

First, an example of a detailed configuration of the PMOS transistor TrP will be described.

As shown in FIG. 4, the regions of the PMOS transistor TrP include an N-type well region NW, p⁺ impurity diffusion regions PP1 and PP2, a gate electrode GCp, contact plugs CS and C0, and insulating layers 50a, 55, 56 and 57.

The gate electrode GCp is provided on the insulating layer 50a. The insulating layer 55 is provided on the gate electrode GCp.

The gate electrode GCp includes a semiconductor layer 52a, insulating layer 53a provided on the semiconductor layer 52a, and a conductive layer 54a provided on insulating layer 53a. The semiconductor layer 52a is a P-type semiconductor layer and is, for example, a polysilicon layer doped with B.

The insulating layer 53a includes $SiO_2$, for example. The insulating layer 53a may be a native oxide film. The thickness L1 of the insulating layer 53a in the Z direction is determined such that it does not affect the conductivity between the upper and lower films of the insulating layer 53a. The insulating layer 53a is used as a diffusion preventing layer that suppresses the diffusion of B from the semiconductor layer 52a into the conductive layer 54a. The conductive layer 54a is made of a conductive material, and the conductive material includes, for example, tungsten silicide (WSi). For example, the insulating layer 53a and the conductive layer 54a may contain B as a result of the diffusion of B from the semiconductor layer 52a.

The insulating layer 55 functions, for example, as an etching stopper when the contact plug C0 is formed. The insulating layer 55 contains, for example, silicon nitride (SiN).

The insulating layer 56 is provided on the side surfaces of the insulating layer 50a, the gate electrode GCp, and the insulating layer 55, and the insulating layer 57 is provided on the insulating layer 56. The insulating layers 56 and 57 are used as sidewalls of the gate electrode of the PMOS transistor TrP.

In a configuration related to the PMOS transistor TrP described above, the contact plug C0 is formed in a contact hole provided in the insulating layers 31 and 55, and the bottom surface of the contact plug C0 is in contact with the conductive layer 54a.

The contact plugs CS are formed in a contact hole provided in the insulating layers 31 and 57, and the bottom surface of the contact plugs CS are in contact with the p⁺ impurity diffusion region PP1 or PP2.

Each of the contact plugs C0 and CS includes, for example, conductive layers 58 and 59. For example, the conductive layer 58 is formed on the bottom and side surfaces of each of the contact holes. The conductive layer 58 functions as a barrier metal. The conductive layer 58 has a laminated structure of, for example, titanium (Ti) and titanium nitride (TiN). The conductive layer 59 is formed such that it is in contact with the side and bottom surfaces of the conductive layer 58 and fills the contact hole. The conductive layer 59 includes tungsten (W), for example.

The detailed configurations of the contact plugs C0 and CS of the PMOS transistor TrP are applicable to the contact plugs C0 and CS of the NMOS transistor TrN.

Next, an example of a detailed configuration of the NMOS transistor TrN will be described.

As shown in FIG. 4, the regions of the NMOS transistor TrN include a P-type well region PW, n⁺ impurity diffusion regions NP1 and NP2, a gate electrode GCn, contact plugs CS and C0, and insulating layers 50b, 55, 56 and 57.

The gate electrode GCn is provided on the insulating layer 50b. The insulating layer 55 is provided on the gate electrode GCn.

The gate electrode GCn includes a semiconductor layer 52b, insulating layer 53b provided on the semiconductor layer 52b, and a conductive layer 54b provided on insulating layer 53b. The semiconductor layer 52b is an N-type semiconductor layer and is, for example, a polysilicon layer doped with phosphorus (P).

Insulating layer 53b includes $SiO_2$, for example. The insulating layer 53b may be a native oxide film. The thickness L2 of the insulating layer 53b in the Z direction is determined such that it does not affect the conductivity between the upper and lower films of the insulating layer 53b. The film thickness L1 and the film thickness L2 satisfies relationship of L1>L2. The insulating layer 53b is used as a diffusion preventing layer that suppresses the diffusion of P from the semiconductor layer 52b into the conductive layer 54b. The conductive layer 54b is made of a conductive material, and the conductive material includes, for example, WSi. For example, the insulating layer 53b and the conductive layer 54a may contain P as a result of the diffusion of P from the semiconductor layer 52b.

The configurations of the insulating layers 55 to 57 are similar to the corresponding the configuration of the PMOS transistor TrP.

In a configuration related to the NMOS transistor TrN described above, the contact plug C0 is formed in a contact hole provided in the insulating layers 31 and 55, and the bottom surface of the contact plug C0 is in contact with the conductive layer 54b.

The contact plugs CS are formed in the contact holes provided in insulating layers 31 and 57, and the bottom surface of the contact plug CS is in contact with the n+ impurity diffusion region NP1 or NP2.

1.2 Manufacturing Method of Insulating Layers 53a and 53b

Next, a method for manufacturing insulating layers 53a and 53b will be described with reference to FIGS. 5 to 9.

Figure 5:
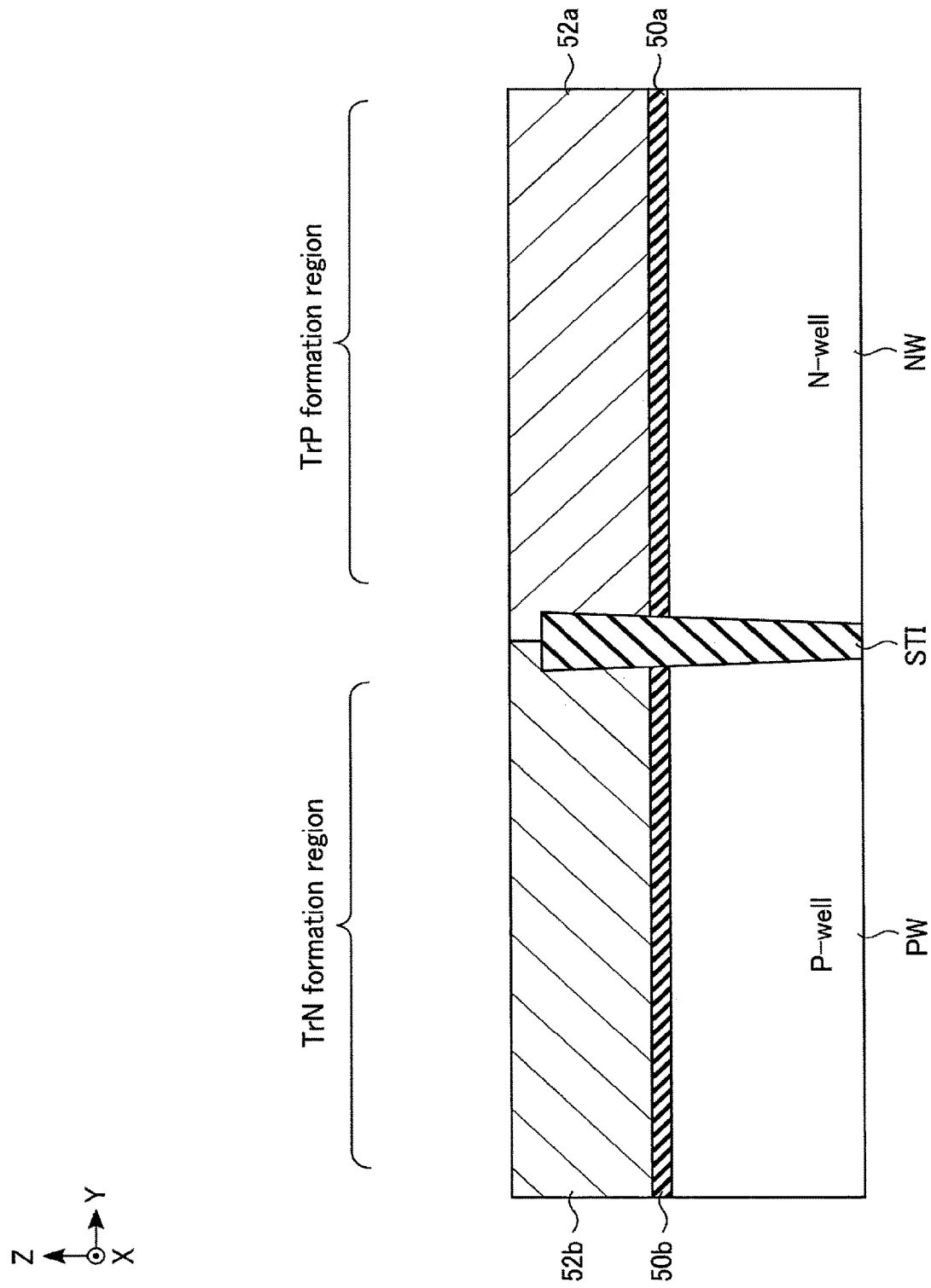

As shown in FIG. 5, in the region where the PMOS transistor TrP is to be formed (hereinafter also referred to as "TrP formation region"), the insulating layer 50a and the semiconductor layer 52a are formed on an N-type well region NW, and in the region where the NMOS transistor TrN is to be formed (hereinafter also referred to as "TrN formation region"), the insulating layer 50b and the semiconductor layer 52b are formed on a P-type well region PW. In the example shown in FIG. 5, the semiconductor layers 52a and 52b are in partial contact with each other on an element isolation region STI. However, the semiconductor layers 52a and 52b may be completely isolated by the element isolation region STI.

Figure 6:
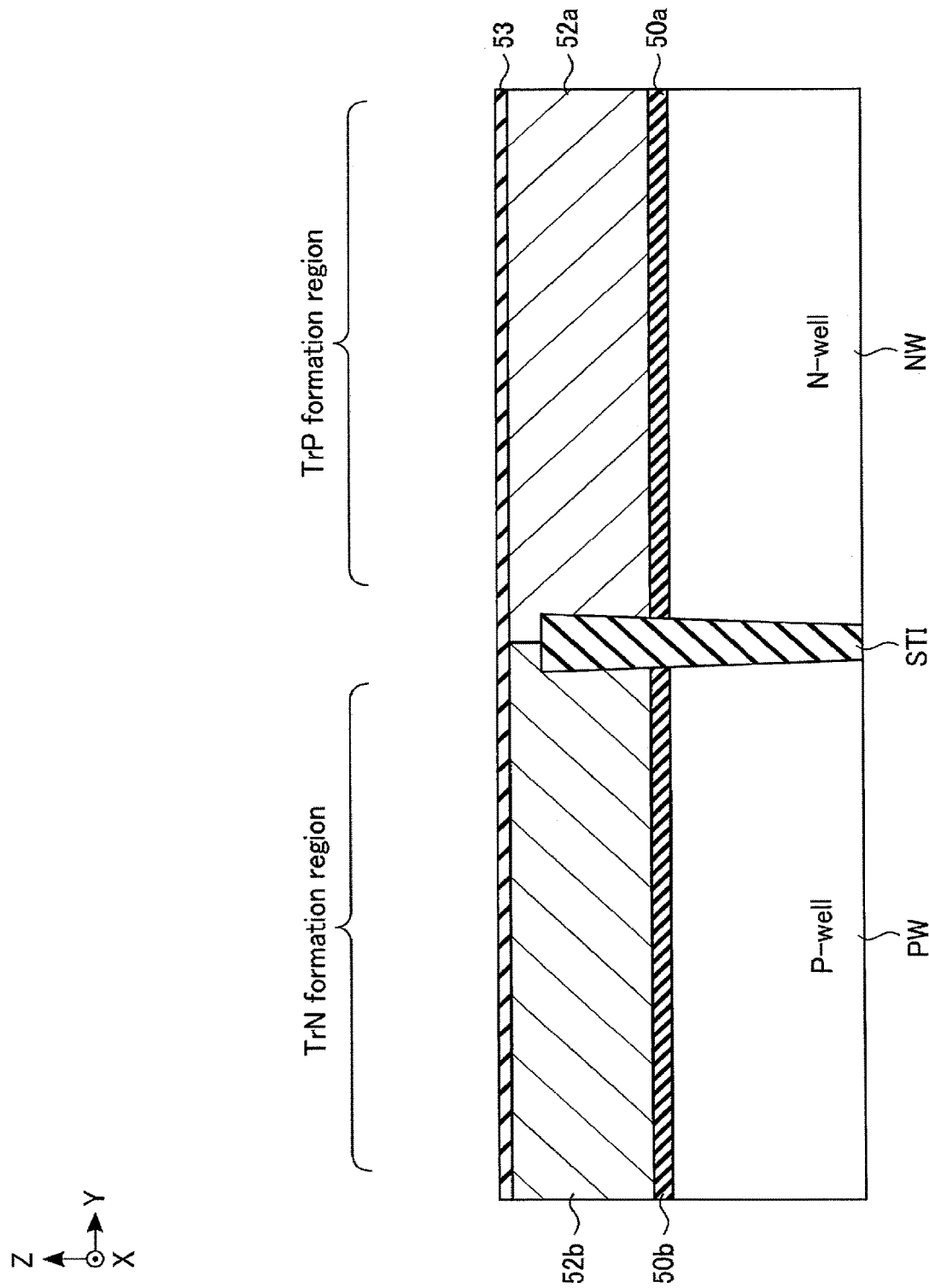

As shown in FIG. 6, an insulating layer 53 is formed on the semiconductor layers 52a and 52b by, for example, natural oxidation or thermal oxidation. The insulating layer 53 includes $SiO_2$, for example. Where the insulating layer 53 is formed, accelerated oxidation may have an effect on the thickness of the insulating layer 53 in the Z direction, and the thickness of the insulating layer 53 in the Z direction is allowed to be thicker on the semiconductor layer 52b containing P than on the semiconductor layer 52a containing B.

Figure 7:
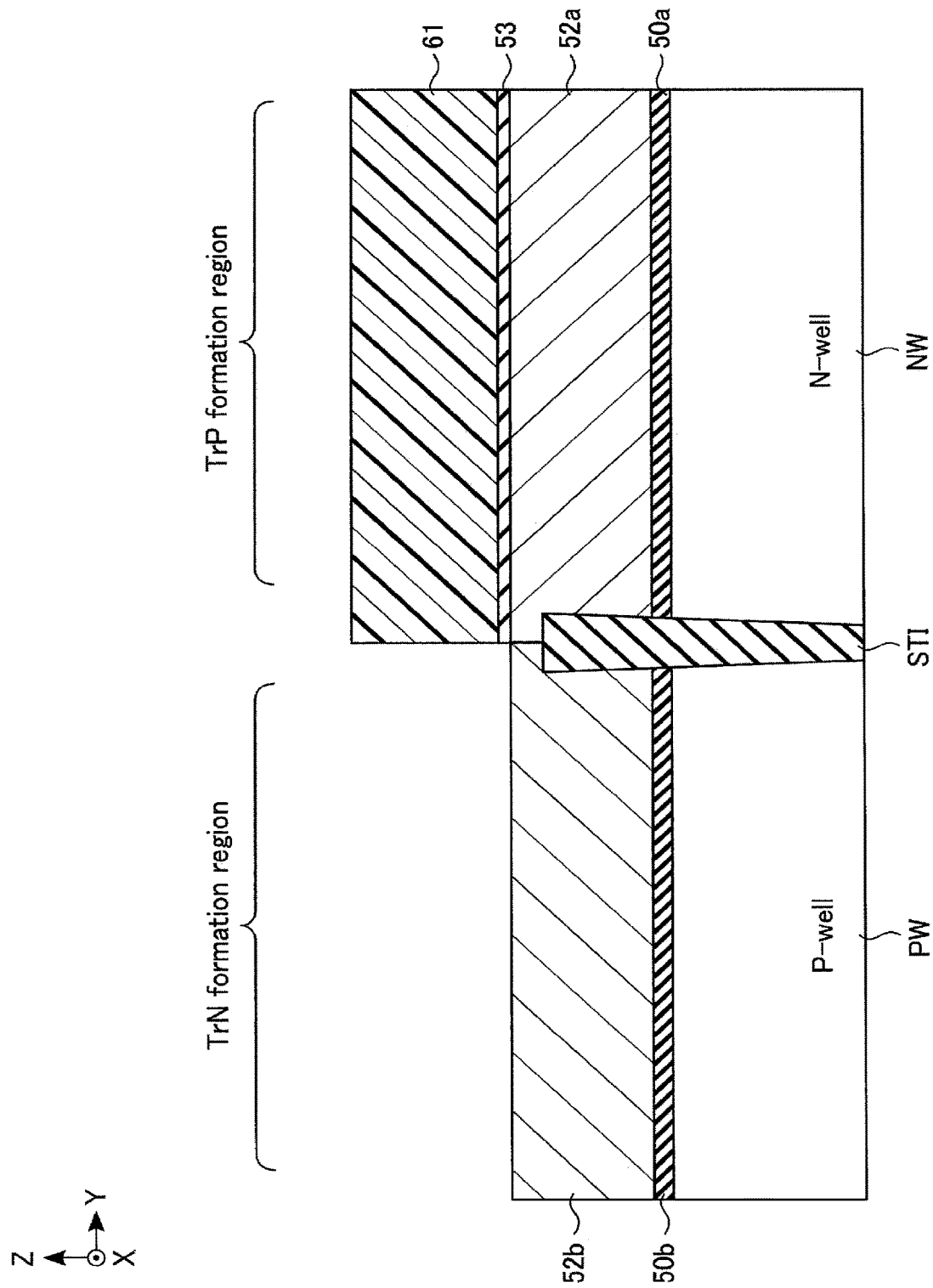

As shown in FIG. 7, a resist 61 is formed in such a manner as to mask the insulating layer 53 on the semiconductor layer 52a. Next, the insulating layer 53 on the semiconductor layer 52b is removed by wet etching or the like. Then, the resist 61 is removed.

As shown in FIG. 8, an insulating layer 53 having film thickness L2 is formed. As a result, an insulating layer 53 having film thickness L2 (the insulating layer 53b) is formed in the TrN formation region, and an insulating layer 53 having the film thickness L1 thicker than the film thickness L2 (the insulating layer 53a) is formed in the TrP formation region. As shown in FIG. 9, a conductive layer 54 and an insulating layer 55 are formed on the insulating layer 53. Thereafter, the gate electrodes GCp and GCn shown in FIG. 4 are formed. The insulating layer 53 and the conductive layer 54 located in the TrP formation region become the insulating layer 53a and the conductive layer 54a, and the insulating layer 53 and the conductive layer 54 located in the TrN formation region become the insulating layer 53b and the conductive layer 54b.

1.3 Advantages of Present Embodiment

With the configuration of the present embodiment, a high-quality semiconductor device can be provided. This advantage will be described in detail.

In the semiconductor device manufacturing process, the conductive layer 54 is formed above the semiconductor layers 52a and 52b, as shown in, for example, FIG. 9. That is, the conductive layer 54a and the conductive layer 54b are not separated until the formation of the gate electrodes is completed. At this time, if the insulating layers 53a and 53b are not provided, interdiffusion of B in the semiconductor layer 52a and P in the semiconductor layer 52b may occur through the conductive layer 54. If this occurs, the interface resistances of the semiconductor layers 52a and 52b may be increased.

In addition, if the thickness of the insulating layer 53a in the Z direction is substantially the same as the thickness of the insulating layer 53b in the Z direction, the diffusion of B from the semiconductor layer 52a to the conductive layer 54a takes place more easily than the diffusion of P from the semiconductor layer 52b into the conductive layer 54b. If B is diffused, in the semiconductor layer 52a, the interface resistance between the semiconductor layer 52a and the insulating layer 53 may increase, or the resistance value of the conductive layer 54a may increase. As a result, the resistance of the gate electrode of the PMOS transistor TrP increases, and the characteristics of the PMOS transistor TrP deteriorate.

In the manufacturing process of the semiconductor device, if the insulating layers 53 (the insulating layers 53a and 53b) are formed at one time on the semiconductor layer 52a containing B and the semiconductor layer 52b containing P, accelerated oxidation may occur due to P, and the thickness of the insulating layer 53b in the Z direction tends to be thicker than the thickness of the insulating layer 53a in the Z direction. In this case, the upper limit of the thickness of the insulating layer 53a is determined by the thickness of the insulating layer 53b that ensures the conductivity between the semiconductor layer 52b and the conductive layer 54b. For this reason, the insulating layer 53a may not have a sufficient film thickness for suppressing the diffusion of B.

In contrast, with the configuration of the present embodiment, the thickness of insulating layer 53a on the semiconductor layer 52a in the Z direction can be made thicker than the thickness of the insulating layer 53b on semiconductor layer 52b in the Z direction. For this reason, the diffusion of B from the semiconductor layer 52a to the conductive layer 54a can be suppressed. As a result, an increase in the resistance of the gate electrode of the PMOS transistor TrP can be suppressed, and the quality of the transistor can therefore be improved. Hence, a high-quality semiconductor device can be provided.

Also, with the configuration of the present embodiment, in the NMOS transistor TrN, the thickness of insulating layer 53b in the Z direction can be made thinner than that of the insulating layer 53a, so that an increase in the resistance of the gate electrode due to the insulating layer 53b can be suppressed.

Further, with the configuration of the present embodiment, interdiffusion of B in the semiconductor layer 52a and P in the semiconductor layer 52b can be suppressed in the manufacturing process of the semiconductor device.

2. Second Embodiment

Then, a description will be given of the second embodiment. In connection with the second embodiment, a description will be given as to how a configuration of a PMOS transistor TrP differs from that of the first embodiment. Hereinafter, a description will be given focusing on differences from the first embodiment.

2.1 Configuration of PMOS Transistor

A detailed configuration of a PMOS transistor TrP will be described with reference to FIG. 10. The configuration of an NMOS transistor TrN is similar to that described in connection with the first embodiment.

Figure 10:
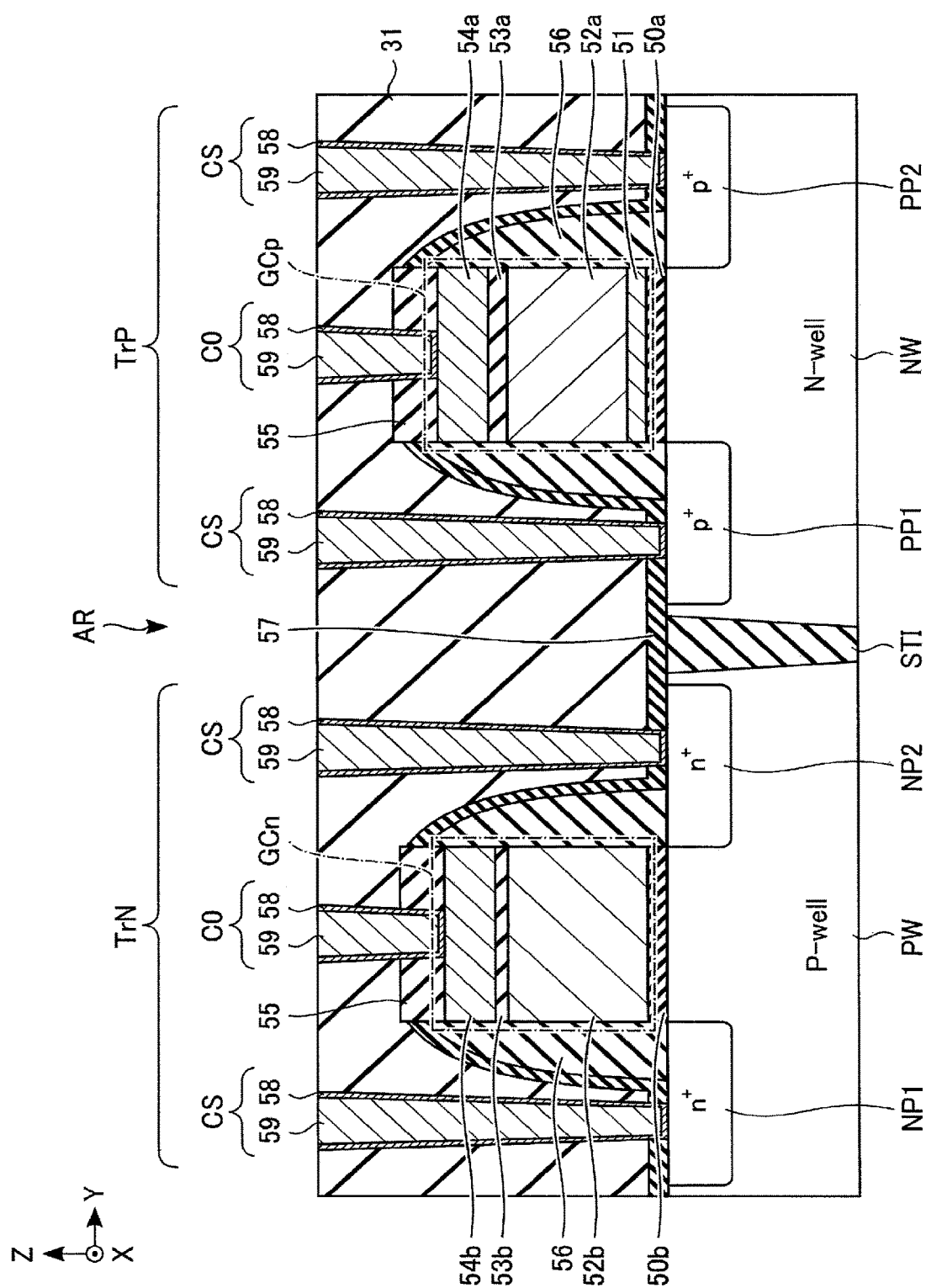
FIG. 10 is a cross-sectional view showing an example of a PMOS transistor and an NMOS transistor that are provided in a semiconductor device according to a second embodiment.

As shown in FIG. 10, unlike FIG. 4 of the first embodiment, a semiconductor layer 51 is provided between the insulating layer 50a and the semiconductor layer 52a of the PMOS transistor TrP. The semiconductor layer 51 is a P-type semiconductor layer containing carbon (C), and is, for example, a polysilicon layer doped with B and C. It should be noted that the C concentration in the semiconductor layer 51 do not have to be uniform in the Z direction. The semiconductor layer 51 is used as a diffusion preventing layer that suppresses the diffusion of B from the semiconductor layer 52a to the N-type well region NW through the insulating layer 50a. It should be noted that C contained in the semiconductor layer 51 may diffuse into the semiconductor layer 52a, so that inclusion of C in the semiconductor layer 52a is permissible. At this time, the C concentration in the semiconductor layer 52a is lower than the C concentration in the semiconductor layer 51.

2.2 Advantages of Present Embodiment

With the configuration of the present embodiment, the advantages similar to those of the first embodiment can be obtained.

Further, in the configuration of the present embodiment, the semiconductor layer 51 is provided between the insulating layer 50a and the semiconductor layer 52a of the PMOS transistor TrP. Thus, the diffusion of B from the semiconductor layer 52a to N-type well region NW can be suppressed. As a result, depletion of the gate in the semiconductor layer 52a can be suppressed, and an increase in the resistance of the gate electrode of the PMOS transistor TrP can be suppressed. Hence, the quality of transistors can be improved, and a high-quality semiconductor device can be provided.

3. Third Embodiment

Then, a description will be given of the third embodiment. In connection with the third embodiment, a description will be given as to how a configuration of an NMOS transistor TrN differs from that of the first embodiment. Hereinafter, a description will be given focusing on the differences from the first and second embodiments.

3.1 Configuration of NMOS Transistor

A detailed configuration of an NMOS transistor TrN will be described with reference to FIG. 11. The configuration of a PMOS transistor TrP is similar to that described in connection with the first embodiment.

As shown in FIG. 11, unlike FIG. 4 of the first embodiment, a semiconductor layer 62 is provided between the insulating layer 53b and the semiconductor layer 52b of the NMOS transistor TrN.

The semiconductor layer 62 is an N-type semiconductor layer containing carbon (C), and is, for example, a polysilicon layer doped with P and C. It should be noted that the C concentration in the semiconductor layer 62 do not have to be uniform in the Z direction. The semiconductor layer 62 is used as a diffusion preventing layer that suppresses the diffusion of P from the semiconductor layer 52b to the conductive layer 54b through the insulating layer 53b. It should be noted that C contained in the semiconductor layer 62 may diffuse into the semiconductor layer 52b, so that inclusion of C in the semiconductor layer 52b is permissible.

At this time, the C concentration in the semiconductor layer 52b is lower than the C concentration in the semiconductor layer 62.

3.2 Manufacturing Method of Insulating Layers 53a and 53b

Next, a method for manufacturing insulating layers 53a and 53b will be described with reference to FIGS. 12 to 13.

Figure 12:
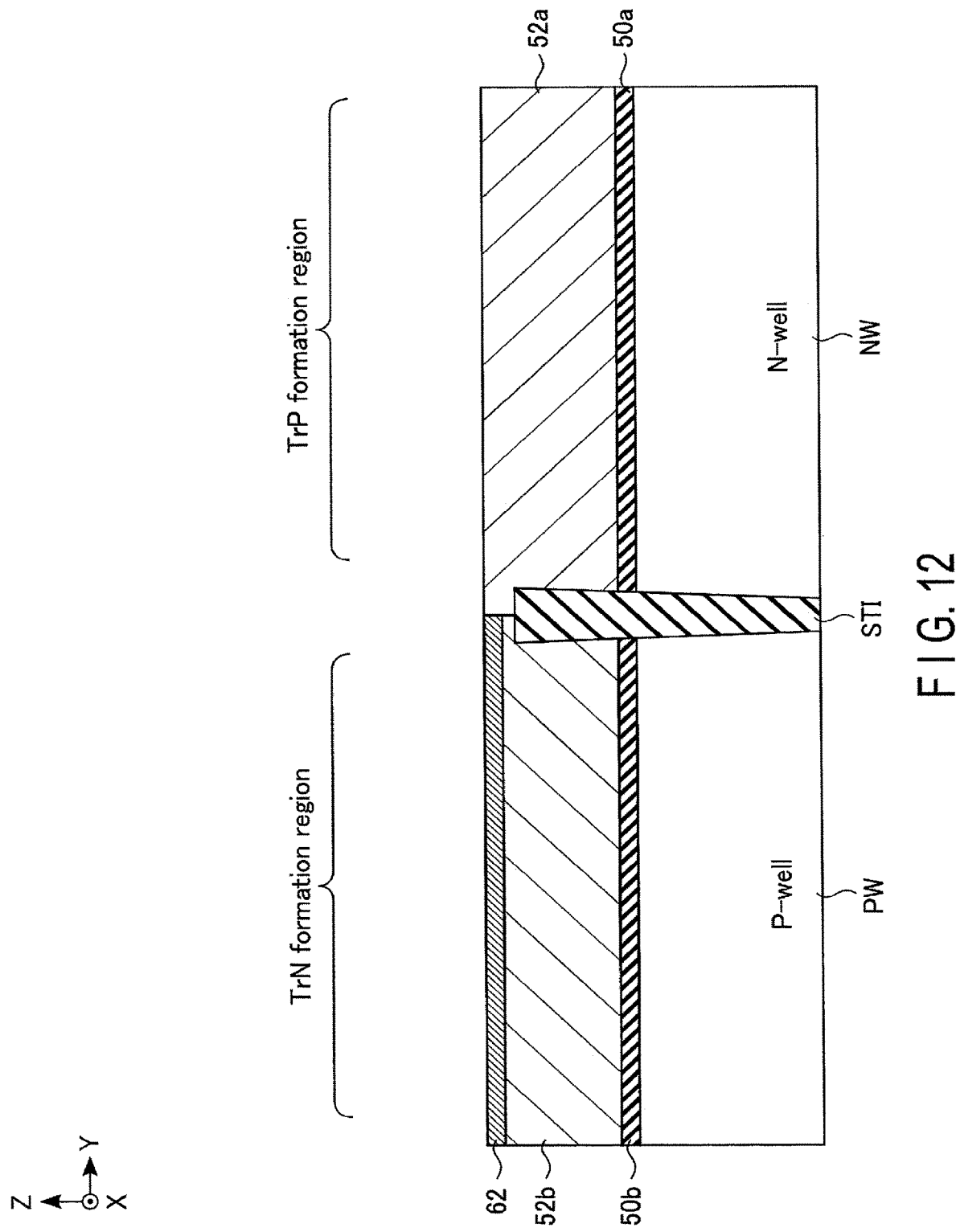
FIGS. 12 and 13 are diagrams showing an example of a process of manufacturing the semiconductor device according to the third embodiment.

As shown in FIG. 12, in the TrP formation region, the insulating layer 50a and the semiconductor layer 52a are formed on a N-type well region NW, and in the TlN formation region, the insulating layer 50b, the semiconductor layer 52b and the semiconductor layer 62 are formed on an P-type well region PW. For example, the semiconductor layer 62 is formed by doping C into the surface region of the semiconductor layer 52b by ion implantation.

Figure 13:
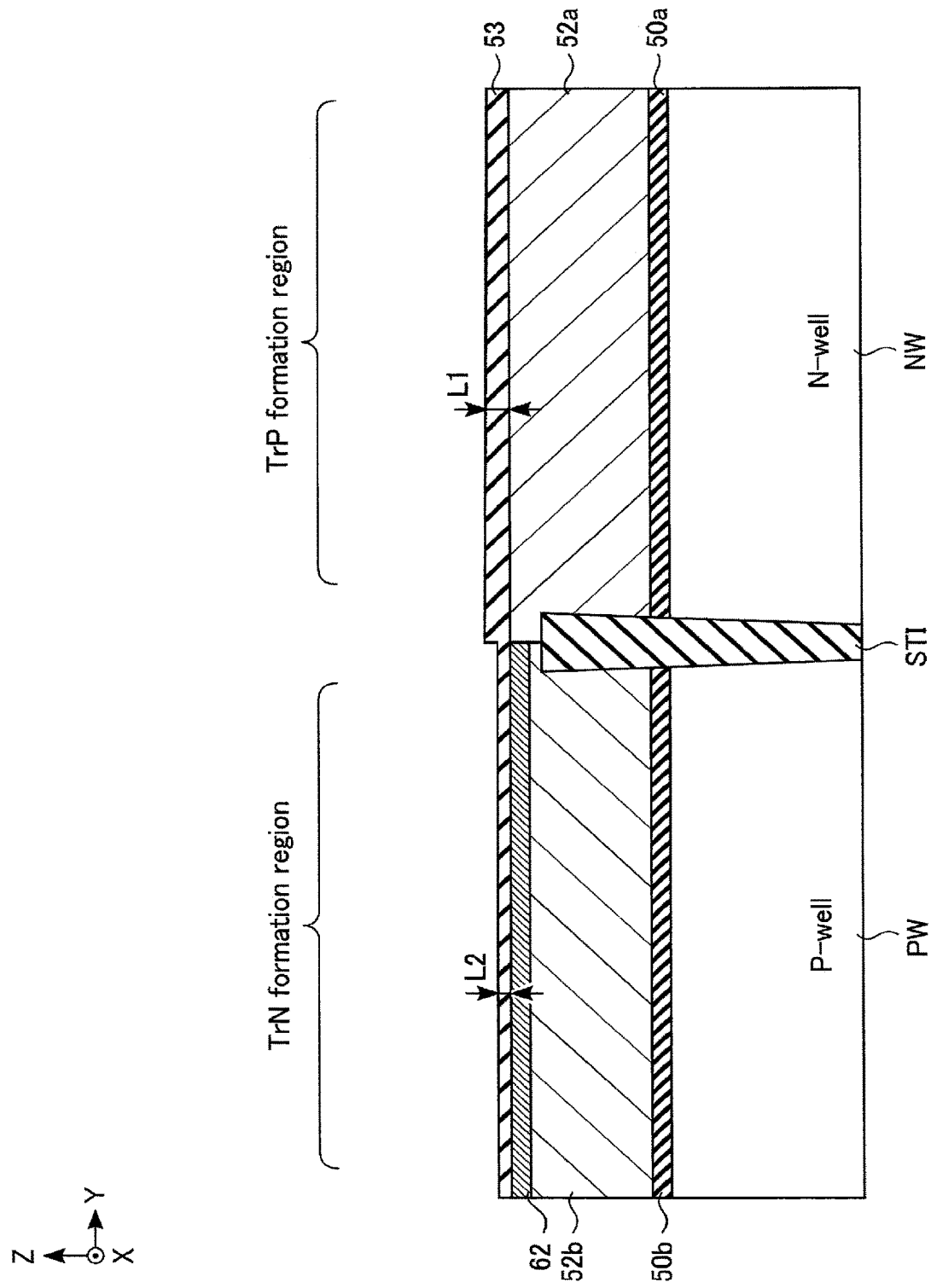

As shown in FIG. 13, the insulating layer 53 is formed on the semiconductor layer 52a and the semiconductor layer 62. The insulating layer 53 may be a native oxide film or a thermal oxide film. At this time, surface oxidation of the upper surface of the semiconductor layer 62 is suppressed more than that of the upper surface of the semiconductor layer 52a. As a result, the thickness L1 of the insulating layer 53 in the Z direction in the TrP formation region is thicker than the thickness L2 of the insulating layer 53 in the Z direction in the TrN formation region.

3.3 Advantages of Present Embodiment

With the configuration of the present embodiment, the advantages similar to those of the first embodiment can be obtained.

Further, in the configuration of the present embodiment, the semiconductor layer 62 is provided between the semiconductor layer 52b and the insulating layer 53b. For this reason, the diffusion of P from the semiconductor layer 52b to the conductive layer 54a can be suppressed. As a result, an increase in the interface resistance in the semiconductor layer 52b can be suppressed, and an increase in the resistance of the gate electrode of the NMOS transistor TrN can be suppressed. Hence, the quality of transistors can be improved, and a high-quality semiconductor device can be provided.

4. Fourth Embodiment

Then, a description will be given of the fourth embodiment. The fourth embodiment will be described, referring to the case where the second embodiment and the third embodiment are combined. Hereinafter, a description will be given focusing on differences from the first to third embodiments.

4.1 Configuration of PMOS Transistor and NMOS Transistor

Detailed configurations of a PMOS transistor TrP and an NMOS transistor TrN of the present embodiment will be described with reference to FIG. 14.

Figure 14:
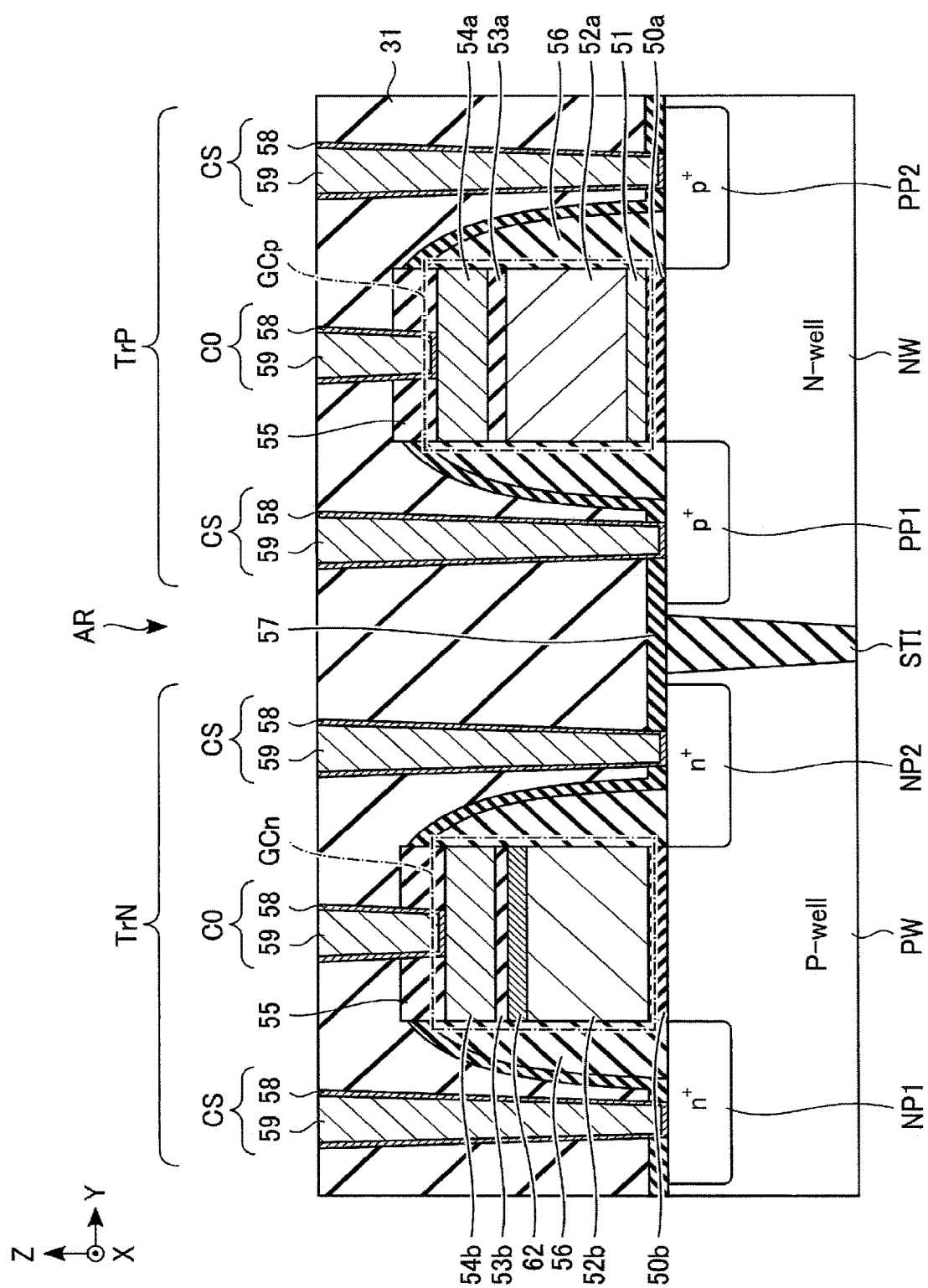
FIG. 14 is a cross-sectional view showing an example of a PMOS transistor and an NMOS transistor that are provided in a semiconductor device according to a fourth embodiment.

As shown in FIG. 14, the configuration of the gate electrode GCp of the PMOS transistor TrP is similar to that described in connection with FIG. 10 of the second embodiment, and the semiconductor layer 51 is provided between the insulating layer 50a and the semiconductor layer 52a. The configuration of the gate electrode GCn of the NMOS transistor TrN is similar to that described in connection with FIG. 11 of the third embodiment, and the semiconductor layer 62 is provided between the semiconductor layer 52b and the insulating layer 53b.

4.2 Advantages of Present Embodiment

With the configuration of the present embodiment, the advantages similar to those of the first to third embodiments can be obtained.

5. Fifth Embodiment

Then, a description will be given of the fifth embodiment. In connection with the fifth embodiment, a description will be given as to how configurations of a PMOS transistor TrP and an NMOS transistor differ from those of the first to fourth embodiments. Hereinafter, a description will be given focusing on differences from the first to fourth embodiments.

5.1 Configurations of PMOS Transistor and NMOS Transistor

Detailed configurations of a PMOS transistor TrP and an NMOS transistor TrN of the present embodiment will be described with reference to FIG. 15.

Figure 15:
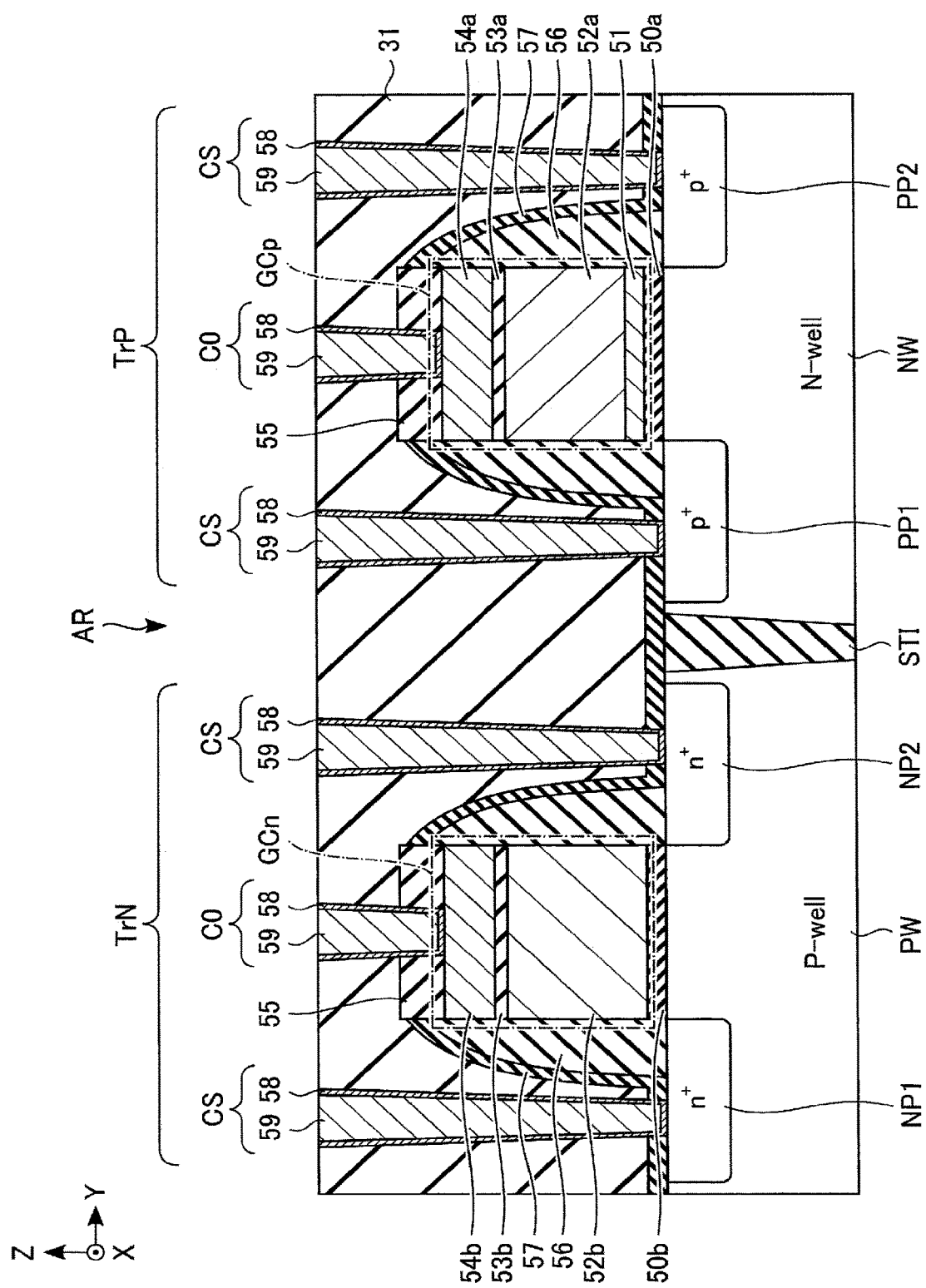
FIG. 15 is a cross-sectional view showing an example of a PMOS transistor and an NMOS transistor that are provided in a semiconductor device according to a fifth embodiment.

As shown in FIG. 15, in the present embodiment, the film thickness of the insulating layer 53a in the Z direction and the film thickness of the insulating layer 53b in the Z direction are substantially the same. Like FIG. 10 of the second embodiment, the semiconductor layer 51 is provided between the insulating layer 50a and the semiconductor layer 52a of the PMOS transistor TrP.

5.2 Advantages of Present Embodiment

With the configuration of the present embodiment, the advantages similar to those of the second embodiment can be obtained.

6. Sixth Embodiment

Then, a description will be given of the sixth embodiment. In connection with the sixth embodiment, a description will be given as to how configurations of a PMOS transistor TrP and an NMOS transistor differ from those of the first to fifth embodiments. Hereinafter, a description will be given focusing on differences from the first to fifth embodiments.

6.1 Configurations of PMOS Transistor and NMOS Transistor

Detailed configurations of a PMOS transistor TrP and an NMOS transistor TrN of the present embodiment will be described with reference to FIG. 16.

As shown in FIG. 16, unlike FIG. 15 of the fifth embodiment, a semiconductor layer 60a is provided between the semiconductor layer 52a and the insulating layer 53a of the PMOS transistor TrP. Also, a semiconductor layer 60b is provided between the semiconductor layer 52b and the insulating layer 53b of the NMOS transistor TrN. The semiconductor layer 60a is a P-type semiconductor layer containing C, and is, for example, a polysilicon layer doped with B and C. The semiconductor layer 60b is an N-type semiconductor layer containing C, and is, for example, a polysilicon layer doped with P and C. It should be noted that the C concentration in the semiconductor layers 60a and 60b do not have to be uniform in the Z direction. Further, the semiconductor layers 60a and 60b may be formed at one time by doping C into the surface regions of the semiconductor layers 52a and 52b. The semiconductor layer 60a is used as a diffusion preventing layer that suppresses the diffusion of B from the semiconductor layer 52a to the conductive layer 54a through the insulating layer 53a. Also, the semiconductor layer 60b is used as a diffusion preventing layer that suppresses the diffusion of P from the semiconductor layer 52b to the conductive layer 54b through the insulating layer 53b. It should be noted that C contained in the semiconductor layer 60a may diffuse into semiconductor layer 52a, so that inclusion of C in the semiconductor layer 52a is permissible. At this time, the C concentration in the semiconductor layer 52a is lower than the C concentration in the semiconductor layer 60a. It should be also noted that C contained in the semiconductor layer 60b may diffuse into the semiconductor layer 52b, so that inclusion of C in the semiconductor layer 52b is permissible. At this time, the C concentration in the semiconductor layer 52b is lower than the C concentration in the semiconductor layer 60b.

6.2 Advantages of Present Embodiment

With the configuration of the present embodiment, the advantages similar to those of the second embodiment can be obtained.

In the configuration of the present embodiment, the semiconductor layer 60a is provided between the semiconductor layer 52a and the insulating layer 53a. For this reason, the diffusion of B from the semiconductor layer 52a to the conductive layer 54a can be suppressed. As a result, an increase in the interface resistance in semiconductor layer 52a can be suppressed.

Further, in the configuration of the present embodiment, the semiconductor layer 60b is provided between the semiconductor layer 52b and the insulating layer 53b. For this reason, the diffusion of P from the semiconductor layer 52b to the conductive layer 54a can be suppressed.

7. Modifications

A semiconductor device according to above-described embodiments includes: a first well region of N-type (NW) and a second well region of P-type (PW), the first well region and the second well region are provided in a surface region of a substrate; a PMOS transistor provided in the first well region; and an NMOS transistor provided in the second well region. The PMOS transistor includes: a first gate insulating layer (50a) provided on the first well region; and a first gate electrode (GCp) provided on the first gate insulating layer. The NMOS transistor includes: a second gate insulating layer (50b) provided on the second well region; and a second gate electrode (GCn) provided on the second gate insulating layer. The first gate electrode includes: a first semiconductor layer of P-type (52a); a first insulating layer (53a) provided on the first semiconductor layer; and a first conductive layer (54a) provided on the first insulating layer. The second gate electrode includes: a second semiconductor layer of N-type (52b); a second insulating layer (53b) provided on the second semiconductor layer; and a second conductive layer (54b) provided on the second insulating layer. A film thickness of the first insulating layer is thicker than a film thickness of the second insulating layer.

By application of the aforesaid embodiments, a high-quality semiconductor device can be provided.

The embodiments are not limited to those described above, and various modifications of them can be made.

For example, the above embodiments were described, referring to the case where the semiconductor device is a three-dimensionally stacked NAND flash memory, but the semiconductor device may be embodied as a planar NAND flash memory or may be equipped with a memory other than the NAND flash memories. Further, the semiconductor device does not have to be provided with a memory.

In connection with the above embodiments, reference was made to the case where the memory cell array 10 is provided above the PMOS transistor TrP and the NMOS transistor TrN. However, the memory cell array 10 does not have to be provided above the PMOS transistor TrP and the NMOS transistor TrN.

In the sixth embodiment, semiconductor layer 51 may be omitted.

In addition, the "coupling" as used in the above embodiments includes a state where a transistor, a resistor or the like may be interposed between the coupled elements.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device comprising:
    forming a first well region of N-type and a second well region of P-type, the first well region and the second well region being provided in a surface region of a substrate;
    forming an element isolation region between the first well region and the second well region; and
    forming a PMOS transistor in the first well region and an NMOS transistor in the second well region, the PMOS transistor including a side wall, a first gate insulating layer provided on the first well region, and a first gate electrode provided on the first gate insulating layer, and the NMOS transistor including a second gate insulating layer provided on the second well region and a second gate electrode provided on the second gate insulating layer,
    wherein
    the first gate electrode includes:
        a first semiconductor layer of P-type, a side surface of the first semiconductor layer being in contact with the side wall;
        a first insulating layer provided on the first semiconductor layer, a side surface of the first insulating layer being in contact with the side wall;
        a first conductive layer provided on the first insulating layer, a side surface of the first conductive layer being in contact with the side wall; and
        a third semiconductor layer provided between the first gate insulating layer and the first semiconductor layer, the third semiconductor layer containing P-type semiconductor and carbon,
    the second gate electrode includes:
        a second semiconductor layer of N-type, a side surface of the second semiconductor layer being in contact with the side wall;
        a second insulating layer provided on the second semiconductor layer; and
        a second conductive layer provided on the second insulating layer, and
    the forming the PMOS transistor and the NMOS transistor includes:
        forming the first gate insulating layer on the first well region;
        forming the second gate insulating layer on the second well region;
        forming the first semiconductor layer of P-type on the first gate insulating layer;
        forming the second semiconductor layer of N-type on the second gate insulating layer; and
        forming the first insulating layer and the second insulating layer, a film thickness of the first insulating layer being thicker than a film thickness of the second insulating layer.

2. The method for manufacturing the semiconductor device according to claim 1, wherein
    the forming the first insulating layer and the second insulating layer includes:
        forming a third insulating layer;
        forming a mask on the third insulating layer in a PMOS transistor formation region;
        removing a part of the third insulating layer in an NMOS transistor formation region;
        removing the mask; and
        forming the second insulating layer in the PMOS transistor formation region and the NMOS transistor formation region.

3. The method for manufacturing the semiconductor device according to claim 2, wherein
    the first insulating layer includes at least a part of the third insulating layer and a part of the second insulating layer.

4. The method for manufacturing the semiconductor device according to claim 1, further comprising:
    forming a first interconnect layer above the PMOS transistor and the NMOS transistor;
    forming a plurality of second interconnect layers apart from each other above the first interconnect layer; and
    forming a fifth semiconductor layer penetrating through the second interconnect layers and being contact with the first interconnect layer.

5. The method for manufacturing the semiconductor device according to claim 4, further comprising:
    forming a fifth insulating layer;
    forming a charge storage layer on the fifth insulating layer; and
    forming a sixth insulating layer on the charge storage layer.

6. The method for manufacturing the semiconductor device according to claim 5, wherein
    the fifth semiconductor layer is on the sixth insulating layer.

7. The method for manufacturing the semiconductor device according to claim 4, wherein
    the second gate electrode further includes a fourth semiconductor layer provided between the second semiconductor layer and the second insulating layer, the fourth semiconductor layer containing N-type semiconductor and carbon.

8. A method for manufacturing a semiconductor device comprising:
  forming a first well region of N-type and a second well region of P-type, the first well region and the second well region being provided in a surface region of a substrate;
  forming an element isolation region between the first well region and the second well region; and
  forming a PMOS transistor in the first well region and an NMOS transistor in the second well region, the PMOS transistor including a side wall, a first gate insulating layer provided on the first well region, and a first gate electrode provided on the first gate insulating layer, and the NMOS transistor including a second gate insulating layer provided on the second well region and a second gate electrode provided on the second gate insulating layer,
  wherein
  the first gate electrode includes:
    a first semiconductor layer of P-type, a side surface of the first semiconductor layer being in contact with the side wall;
    a first insulating layer provided on the first semiconductor layer, a side surface of the first insulating layer being in contact with the side wall; and
    a first conductive layer provided on the first insulating layer, a side surface of the first conductive layer being in contact with the side wall,
  the second gate electrode includes:
    a second semiconductor layer of N-type;
    a second insulating layer provided on the second semiconductor layer; and
    a second conductive layer provided on the second insulating layer,
  the forming the PMOS transistor and the NMOS transistor includes:
    forming the first gate insulating layer on the first well region;
    forming the second gate insulating layer on the second well region;
    forming the first semiconductor layer of P-type on the first gate insulating layer;
    forming the second semiconductor layer of N-type on the second gate insulating layer; and
    forming the first insulating layer and the second insulating layer, a film thickness of the first insulating layer being thicker than a film thickness of the second insulating layer, and
  the forming the second semiconductor layer of N-type on the second gate insulating layer includes:
    doping carbon into a surface region of the second semiconductor layer of N-type.

9. The method for manufacturing the semiconductor device according to claim 8, wherein
  the forming the first insulating layer and the second insulating layer includes:
    forming the second insulating layer on the surface region of the second semiconductor layer of N-type.

10. A method for manufacturing a semiconductor device comprising:
  forming a first well region of N-type and a second well region of P-type, the first well region and the second well region being provided in a surface region of a substrate;
  forming an element isolation region between the first well region and the second well region; and
  forming a PMOS transistor in the first well region and an NMOS transistor in the second well region, the PMOS transistor including a side wall, a first gate insulating layer provided on the first well region, and a first gate electrode provided on the first gate insulating layer, and the NMOS transistor including a second gate insulating layer provided on the second well region and a second gate electrode provided on the second gate insulating layer,
  wherein
  the first gate electrode includes:
    a first semiconductor layer of P-type, a side surface of the first semiconductor layer being in contact with the side wall;
    a first insulating layer provided on the first semiconductor layer, a side surface of the first insulating layer being in contact with the side wall; and
    a first conductive layer provided on the first insulating layer, a side surface of the first conductive layer being in contact with the side wall,
  the second gate electrode includes:
    a second semiconductor layer of N-type;
    a second insulating layer provided on the second semiconductor layer;
    a second conductive layer provided on the second insulating layer; and
    a fourth semiconductor layer provided between the second semiconductor layer and the second insulating layer, the fourth semiconductor layer containing N-type semiconductor and carbon, and
  the forming the PMOS transistor and the NMOS transistor includes:
    forming the first gate insulating layer on the first well region;
    forming the second gate insulating layer on the second well region;
    forming the first semiconductor layer of P-type on the first gate insulating layer;
    forming the second semiconductor layer of N-type on the second gate insulating layer; and
    forming the first insulating layer and the second insulating layer, a film thickness of the first insulating layer being thicker than a film thickness of the second insulating layer.

* * * * *